(12) United States Patent
Ulrich

(10) Patent No.: US 10,984,986 B2
(45) Date of Patent: Apr. 20, 2021

(54) IMPEDANCE MATCHING NETWORK AND METHOD

(71) Applicant: Reno Technologies, Inc., Wilmington, DE (US)

(72) Inventor: Michael Gilliam Ulrich, Delran, NJ (US)

(73) Assignee: RENO TECHNOLOGIES, INC.

(*) Notice: Subject to any disclaimer, the term of this patent is extended or adjusted under 35 U.S.C. 154(b) by 0 days.

(21) Appl. No.: 16/654,788

(22) Filed: Oct. 16, 2019

(65) Prior Publication Data

US 2020/0051788 A1 Feb. 13, 2020

Related U.S. Application Data

(63) Continuation-in-part of application No. 16/415,764, filed on May 17, 2019, now Pat. No. 10,692,699, which is a continuation-in-part of application No. 15/816,351, filed on Nov. 17, 2017, now abandoned, which is a continuation-in-part of application No. 15/450,495, filed on Mar. 6, 2017, now Pat. No. 10,679,824, which is a continuation-in-part of
(Continued)

(51) Int. Cl.
*H01J 37/32* (2006.01)
*H03H 7/38* (2006.01)
*H01L 21/3213* (2006.01)

(52) U.S. Cl.
CPC .. *H01J 37/32183* (2013.01); *H01L 21/32136* (2013.01); *H03H 7/383* (2013.01)

(58) Field of Classification Search
CPC ........ H01J 37/32183; H01L 21/32136; H03H 7/383
See application file for complete search history.

(56) References Cited

U.S. PATENT DOCUMENTS

| 3,681,672 A | 8/1972 | Strauss |
| 3,828,281 A | 8/1974 | Chambers |
| 4,110,700 A | 8/1978 | Rosen et al. |

(Continued)

FOREIGN PATENT DOCUMENTS

| EP | 0840349 | 5/1998 |
| EP | 0840350 | 5/1998 |
| WO | 2006096589 | 9/2006 |

OTHER PUBLICATIONS

Graf, Rudolf F., (1999) Modern Disctionary of Electronics—Seventh Edition, pp. 95-96, Butterworth-Heinemann, Massachusetts.

*Primary Examiner* — Samuel S Outten
(74) *Attorney, Agent, or Firm* — The Belles Group, P.C.

(57) ABSTRACT

In one embodiment, an RF impedance matching network for a plasma chamber is disclosed. The matching network includes at least one electronically variable capacitor (EVC), each EVC comprising discrete capacitors each having a corresponding switching circuit. Each switching circuit is configured to switch in and out its corresponding discrete capacitor to alter a total capacitance of the EVC. Each switching circuit include a first diode operably coupled to the discrete capacitor, a capacitor coupled in series with the first diode, and a second diode operably coupled to the discrete capacitor. The second diode parallel to the first diode and the capacitor coupled in series.

21 Claims, 16 Drawing Sheets

Related U.S. Application Data application No. 15/196,821, filed on Jun. 29, 2016, now Pat. No. 10,699,880.

(60) Provisional application No. 62/751,851, filed on Oct. 29, 2018, provisional application No. 62/424,162, filed on Nov. 18, 2016, provisional application No. 62/303,625, filed on Mar. 4, 2016, provisional application No. 62/185,998, filed on Jun. 29, 2015.

(56) References Cited

U.S. PATENT DOCUMENTS

| | | | |
|---|---|---|---|
| 4,486,722 A * | 12/1984 | Landt | H03H 7/40 327/503 |
| 4,679,007 A | 7/1987 | Reese et al. | |
| 4,692,643 A | 9/1987 | Tokunaga et al. | |
| 4,751,408 A | 6/1988 | Rambert | |
| 4,763,087 A | 8/1988 | Schrader | |
| 4,929,855 A | 5/1990 | Ezzeddine | |
| 5,012,123 A | 4/1991 | Ayasli et al. | |
| 5,079,507 A | 1/1992 | Ishida et al. | |
| 5,545,966 A | 8/1996 | Ramos | |
| 5,654,679 A | 8/1997 | Mavretic et al. | |
| 5,815,047 A | 9/1998 | Sorensen et al. | |
| 5,849,136 A | 12/1998 | Mintz et al. | |
| 5,880,921 A | 3/1999 | Tham et al. | |
| 5,889,252 A | 3/1999 | Williams et al. | |
| 5,971,591 A | 10/1999 | Vona et al. | |
| 6,046,641 A | 4/2000 | Chawla et al. | |
| 6,137,367 A | 10/2000 | Ezzedine et al. | |
| 6,252,354 B1 | 6/2001 | Collins et al. | |
| 6,400,012 B1 | 6/2002 | Miller et al. | |
| 6,424,232 B1 | 7/2002 | Mavretic et al. | |
| 6,583,572 B2 | 6/2003 | Veltrop et al. | |
| 6,621,372 B2 | 9/2003 | Kondo et al. | |
| 6,642,661 B2 | 11/2003 | Strang | |
| 6,657,395 B2 | 12/2003 | Windhorn | |
| 6,677,828 B1 | 1/2004 | Harnett et al. | |
| 6,703,080 B2 | 3/2004 | Reyzelman et al. | |
| 6,791,274 B1 | 9/2004 | Hauer et al. | |
| 6,794,951 B2 | 9/2004 | Finley | |
| 6,818,562 B2 | 11/2004 | Todorow et al. | |
| 6,888,313 B2 | 5/2005 | Blackburn et al. | |
| 6,888,396 B2 | 5/2005 | Hajimiri et al. | |
| 6,946,847 B2 | 9/2005 | Nishimori et al. | |
| 6,967,547 B2 | 11/2005 | Pellegrini et al. | |
| 7,004,107 B1 | 2/2006 | Raoux et al. | |
| RE39,051 E | 3/2006 | Harnett | |
| 7,071,786 B2 | 7/2006 | Inoue et al. | |
| 7,095,178 B2 | 8/2006 | Nakano et al. | |
| 7,113,761 B2 | 9/2006 | Bickham et al. | |
| 7,122,965 B2 | 10/2006 | Goodman | |
| 7,164,236 B2 | 1/2007 | Mitrovic et al. | |
| 7,199,678 B2 | 4/2007 | Matsuno | |
| 7,212,406 B2 | 5/2007 | Kaishian et al. | |
| 7,251,121 B2 | 7/2007 | Bhutta | |
| 7,298,091 B2 | 11/2007 | Pickard et al. | |
| 7,298,128 B2 | 11/2007 | Bhutta | |
| 7,304,438 B2 | 12/2007 | Kishinevsky | |
| 7,332,981 B2 | 2/2008 | Matsuno | |
| 7,439,610 B2 | 10/2008 | Weigand | |
| 7,480,571 B2 | 1/2009 | Howald et al. | |
| 7,495,524 B2 | 2/2009 | Omae et al. | |
| 7,498,908 B2 | 3/2009 | Gurov | |
| 7,514,935 B2 | 4/2009 | Pankratz | |
| 7,518,466 B2 | 4/2009 | Sorensen et al. | |
| 7,535,312 B2 | 5/2009 | McKinzie, III | |
| 7,602,127 B2 | 10/2009 | Coumou | |
| 7,642,879 B2 | 1/2010 | Matsuno | |
| 7,666,464 B2 | 2/2010 | Collins et al. | |
| 7,714,676 B2 | 5/2010 | McKinzie, III | |
| 7,728,602 B2 | 6/2010 | Valcore et al. | |
| 7,745,955 B2 | 6/2010 | Kirchmeier et al. | |
| 7,755,300 B2 | 7/2010 | Kishinevsky et al. | |
| 7,764,140 B2 | 7/2010 | Nagarkatti et al. | |
| 7,777,567 B2 | 8/2010 | Polizze | |
| 7,852,170 B2 | 12/2010 | McKinzie, III | |
| 7,863,996 B2 | 1/2011 | Cotter et al. | |
| 7,868,556 B2 | 1/2011 | Xia | |
| 7,872,523 B2 | 1/2011 | Sivakumar et al. | |
| 7,917,104 B2 | 3/2011 | Manssen et al. | |
| 7,969,096 B2 | 6/2011 | Chen | |
| 8,008,982 B2 | 8/2011 | McKinzie, III | |
| 8,040,068 B2 | 10/2011 | Coumou et al. | |
| RE42,917 E | 11/2011 | Hauer et al. | |
| 8,089,026 B2 | 1/2012 | Sellers | |
| 8,102,954 B2 | 1/2012 | Coumou | |
| 8,110,991 B2 | 2/2012 | Coumou | |
| 8,203,859 B2 | 6/2012 | Omae et al. | |
| 8,207,798 B1 | 6/2012 | Wright | |
| 8,217,731 B2 | 7/2012 | McKinzie, III | |
| 8,217,732 B2 | 7/2012 | McKinzie, III | |
| 8,228,112 B2 | 7/2012 | Reynolds | |
| 8,237,501 B2 | 8/2012 | Owen | |
| 8,264,154 B2 | 9/2012 | Banner et al. | |
| 8,278,909 B2 | 10/2012 | Fletcher | |
| 8,289,029 B2 | 10/2012 | Coumou | |
| 8,299,867 B2 | 10/2012 | McKinzie, III | |
| 8,314,561 B2 | 11/2012 | Fisk et al. | |
| 8,330,432 B2 | 12/2012 | Van Zyl et al. | |
| 8,334,657 B2 | 12/2012 | Xia | |
| 8,334,700 B2 | 12/2012 | Coumou et al. | |
| 8,335,479 B2 | 12/2012 | Koya et al. | |
| 8,344,559 B2 | 1/2013 | Van Zyl et al. | |
| 8,344,801 B2 | 1/2013 | Owen et al. | |
| 8,368,308 B2 | 2/2013 | Banna et al. | |
| 8,368,469 B2 | 2/2013 | Mohammadi et al. | |
| 8,395,322 B2 | 3/2013 | Coumou | |
| 8,416,008 B2 | 4/2013 | Van Zyl et al. | |
| 8,436,643 B2 | 5/2013 | Mason | |
| 8,461,842 B2 | 6/2013 | Thuringer et al. | |
| 8,466,736 B1 | 6/2013 | Reynolds | |
| 8,487,706 B2 | 7/2013 | Li et al. | |
| 8,502,689 B2 | 8/2013 | Chen et al. | |
| 8,513,889 B2 | 8/2013 | Zhang et al. | |
| 8,520,413 B2 | 8/2013 | Tran et al. | |
| 8,536,636 B2 | 9/2013 | Englekirk | |
| 8,552,665 B2 | 10/2013 | Larson et al. | |
| 8,558,633 B2 | 10/2013 | McKinzie, III | |
| 8,559,907 B2 | 10/2013 | Burgener et al. | |
| 8,564,381 B2 | 10/2013 | McKinzie | |
| 8,569,842 B2 | 10/2013 | Weis et al. | |
| 8,576,010 B2 | 11/2013 | Yanduru | |
| 8,576,013 B2 | 11/2013 | Coumou | |
| 8,587,321 B2 | 11/2013 | Chen et al. | |
| 8,620,236 B2 | 12/2013 | Manssen et al. | |
| 8,624,501 B2 | 1/2014 | Nagarkatti et al. | |
| 8,633,782 B2 | 1/2014 | Nagarkatti et al. | |
| 8,638,159 B2 | 1/2014 | Ranta et al. | |
| 8,649,754 B2 | 2/2014 | Burgener et al. | |
| 8,659,335 B2 | 2/2014 | Nagarkatti et al. | |
| 8,674,606 B2 | 3/2014 | Carter et al. | |
| 8,680,928 B2 | 3/2014 | Jeon et al. | |
| 8,686,796 B2 | 4/2014 | Presti | |
| 8,710,926 B2 | 4/2014 | Nagarkatti et al. | |
| 8,716,984 B2 | 5/2014 | Mueller et al. | |
| 8,723,423 B2 | 5/2014 | Hoffman et al. | |
| 8,742,669 B2 | 6/2014 | Carter et al. | |
| 8,773,019 B2 | 7/2014 | Coumou et al. | |
| 8,779,859 B2 | 7/2014 | Su et al. | |
| 8,781,415 B1 | 7/2014 | Coumou et al. | |
| 8,815,329 B2 | 8/2014 | Ilic et al. | |
| 8,847,561 B2 | 9/2014 | Karlieek et al. | |
| 8,884,180 B2 | 11/2014 | Ilic et al. | |
| 8,884,525 B2 | 11/2014 | Hoffman et al. | |
| 8,890,537 B2 | 11/2014 | Valcore, Jr. et al. | |
| 8,912,835 B2 | 12/2014 | Nagarkatti et al. | |
| 8,928,329 B2 | 1/2015 | Downing et al. | |
| 9,065,426 B2 | 6/2015 | Mason | |
| 9,083,343 B1 | 7/2015 | Li et al. | |
| 9,190,993 B1 | 11/2015 | Li | |
| 9,306,533 B1 | 4/2016 | Anton | |
| 9,337,804 B2 | 5/2016 | Mason | |
| 9,425,736 B2 | 8/2016 | Kelkar | |

(56) References Cited

U.S. PATENT DOCUMENTS

| | | |
|---|---|---|
| 2002/0060914 A1 | 5/2002 | Porter et al. |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0066438 A1 | 3/2009 | Kim |
| 2009/0207537 A1 | 8/2009 | Coumou |
| 2010/0001796 A1 | 1/2010 | Sivakumar et al. |
| 2010/0039194 A1 | 2/2010 | Darabi et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2010/0253442 A1 | 10/2010 | Mu |
| 2011/0025436 A1 | 2/2011 | Hadji-Abdolhamid |
| 2011/0241781 A1 | 10/2011 | Owen et al. |
| 2011/0247696 A1 | 10/2011 | Zolock et al. |
| 2012/0001496 A1 | 1/2012 | Yamamoto et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2017/0063101 A1 | 3/2017 | Sultenfuss et al. |

* cited by examiner

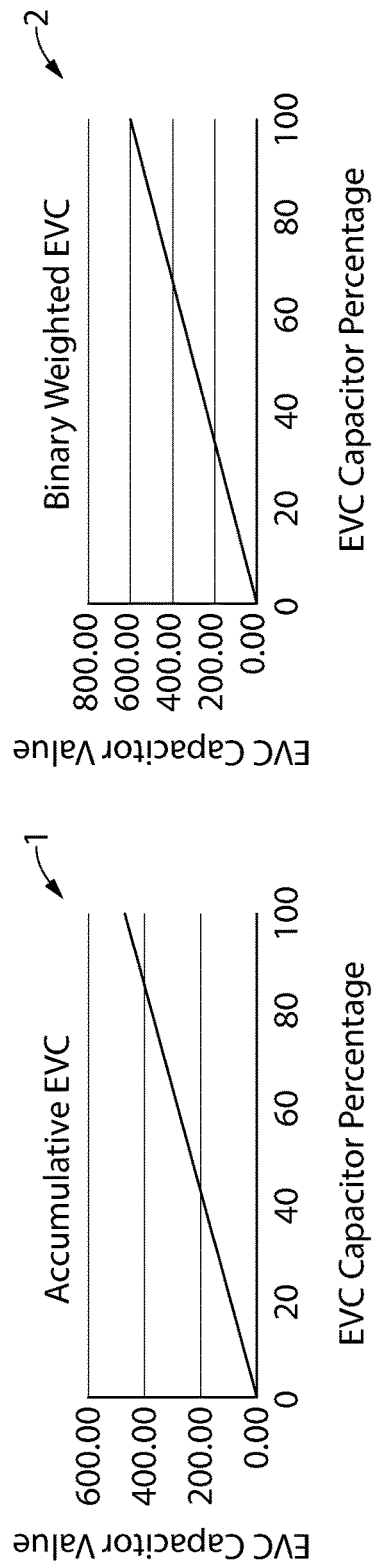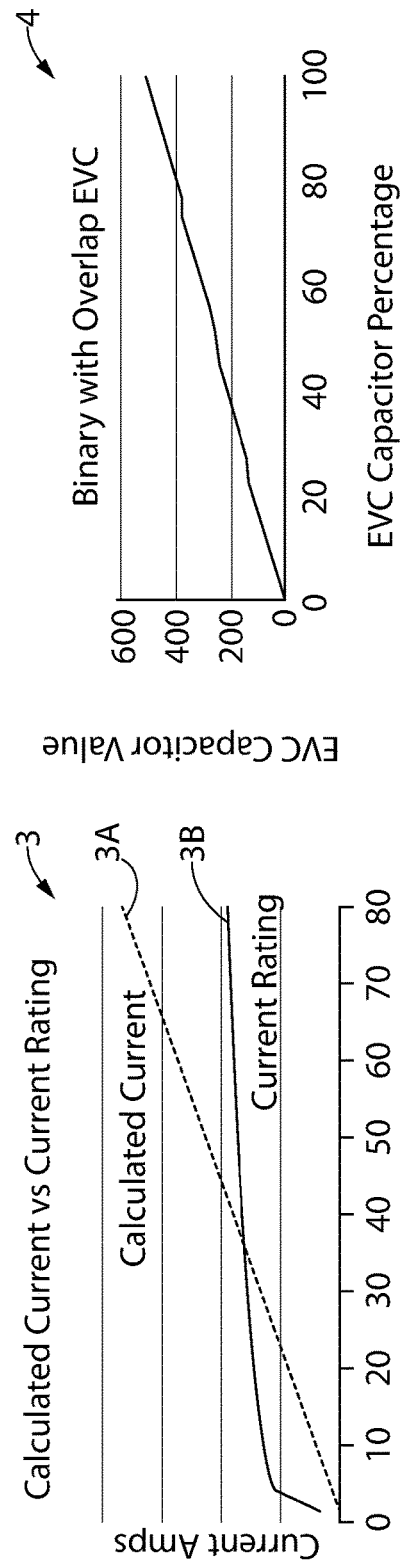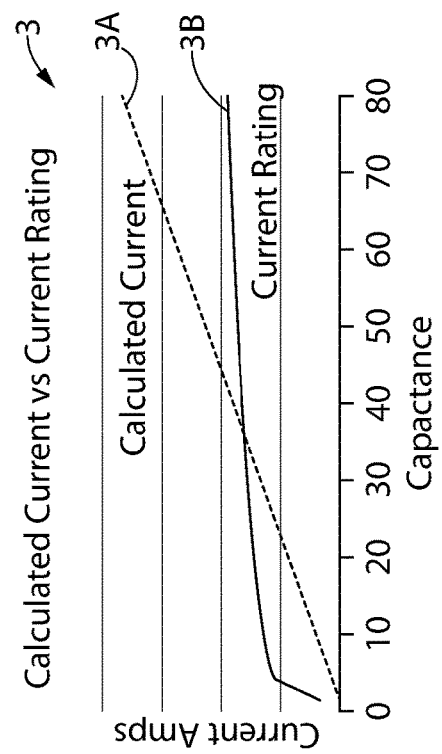
FIG. 12
FIG. 13
FIG. 14
FIG. 15

IMPEDANCE MATCHING NETWORK AND METHOD

CROSS REFERENCE TO RELATED APPLICATIONS

The present application is a continuation in part of U.S. patent application Ser. No. 16/415,764, filed May 17, 2019, which is a continuation in part of U.S. patent application Ser. No. 15/816,351, filed Nov. 17, 2017, which is a continuation in part of U.S. patent application Ser. No. 15/450,495, filed Mar. 6, 2017, which is a continuation in part of U.S. patent application Ser. No. 15/196,821, filed Jun. 29, 2016, which claims the benefit of U.S. Provisional Patent Application No. 62/185,998 filed on Jun. 29, 2015. U.S. patent application Ser. No. 15/450,495 further claims the benefit of U.S. Provisional Patent Application No. 62/303,625, filed Mar. 4, 2016. U.S. patent application Ser. No. 15/816,351 further claims the benefit of U.S. Provisional Patent Application No. 62/424,162, filed Nov. 18, 2016. The present application further claims the benefit of U.S. Provisional Patent Application No. 62/751,851, filed Oct. 29, 2018. The disclosures of the aforementioned priority applications are incorporated herein by reference in their entirety.

BACKGROUND

Variable capacitors are used in many applications, such as matching networks and variable filters. They allow for the precise tuning of frequency and/or impedance in applications needing a dynamic system response, such as in plasma processes. The ability to dynamically change impedance and frequency response provides more flexibility for the applications variable capacitors are used in, and can compensate for variations from unit-to-unit. Some examples of variable capacitors are vacuum variable capacitors (VVCs) and electronically variable capacitors (EVCs).

In electronic circuits, matching networks are used to match the source impedance to the load impedance and vice versa. That is, the source, being of some impedance with a resistive part and a reactive part, will be terminated into the complex conjugate impedance, and the load impedance will be driven by the complex conjugate of its impedance. The complex conjugate is used to eliminate the reactive part of the impedance, leaving only the resistive part, and the resistive part is made equal. This is done so that maximum power transfer can be achieved at the load.

In plasma applications, the load impedance can vary depending on several factors, such as time, power level, pressure, gas flow, chemistry of the gasses, and whether the plasma has been struck. Accordingly, the matching network must be able to automatically vary itself to ensure that the maximum power transfer is achieved. This helps with repeatability in both the depositing and etching.

EVCs use switches to add or remove the discrete capacitors, such as an MLCC (multi-layer ceramic capacitor), that form the EVC. The capacitor-switch circuit is placed in parallel with other capacitor-switch circuits. The parallel circuits allow the discrete capacitors to be simply added or subtracted in the circuit, depending on how many switches are opened or closed. In the case where all the switches are open, the EVC will be at its lowest capacitance value. In the case where they are all closed, the EVC will be at its highest capacitance value.

While EVCs are increasingly used in matching networks, there is need for faster and more reliable switching of the discrete capacitors of the EVCs.

BRIEF SUMMARY

In one aspect, an impedance matching network includes a radio frequency (RF) input operably coupled to an RF source; an RF output operably coupled to a plasma chamber; and at least one electronically variable capacitor (EVC), each EVC comprising discrete capacitors each having a corresponding switching circuit, each switching circuit configured to switch in and out its corresponding discrete capacitor to alter a total capacitance of the EVC; wherein each switching circuit comprises a first diode operably coupled to the discrete capacitor; a capacitor coupled in series with the first diode; and a second diode operably coupled to the discrete capacitor, the second diode parallel to the first diode and the capacitor coupled in series.

In another aspect, a method of matching an impedance includes coupling an RF input of a matching network to an RF source; coupling an RF output of the matching network to a plasma chamber, wherein the matching network comprises at least one EVC, each EVC comprising discrete capacitors each having a corresponding switching circuit, wherein each switching circuit for a corresponding discrete capacitor comprises a first diode operably coupled to the discrete capacitor; a capacitor coupled in series with the first diode; and a second diode operably coupled to the discrete capacitor, the second diode parallel to the first diode and the capacitor coupled in series; and matching an impedance by at least one of the switching circuits of the at least one EVC switching in or out its corresponding discrete capacitor to alter a total capacitance of the EVC.

In another aspect, a semiconductor processing tool includes a plasma chamber configured to deposit a material onto a substrate or etch a material from the substrate; and an impedance matching network operably coupled to the plasma chamber, the matching network comprising a RF input operably coupled to an RF source; an RF output operably coupled to the plasma chamber; and at least one EVC, each EVC comprising discrete capacitors each having a corresponding switching circuit, each switching circuit configured to switch in and out its corresponding discrete capacitor to alter a total capacitance of the EVC; wherein each switching circuit comprises a first diode operably coupled to the discrete capacitor; a capacitor coupled in series with the first diode; and a second diode operably coupled to the discrete capacitor, the second diode parallel to the first diode and the capacitor coupled in series.

In another aspect, a method of manufacturing a semiconductor includes placing a substrate in a plasma chamber configured to deposit a material layer on the substrate or etch a material layer from the substrate; energizing plasma within the plasma chamber by coupling RF power from an RF source to the plasma chamber to perform the deposition or etching; and while energizing the plasma, carrying out an impedance match by an impedance matching network coupled between the plasma chamber and the RF source, the matching network comprising at least one EVC, each EVC comprising discrete capacitors each having a corresponding switching circuit, each switching circuit configured to switch in and out its corresponding discrete capacitor to alter a total capacitance of the EVC; wherein each switching circuit comprises a first diode operably coupled to the discrete capacitor; a capacitor coupled in series with the first diode; and a second diode operably coupled to the discrete capacitor, the second diode parallel to the first diode and the capacitor coupled in series.

BRIEF DESCRIPTION OF THE DRAWINGS

The present disclosure will become more fully understood from the detailed description and the accompanying drawings, wherein:

FIG. 12 is a graph of capacitance for an accumulative EVC according to one embodiment.

FIG. 13 is a graph of a capacitance for a binary weighted EVC according to one embodiment.

FIG. 14 is a graph of current versus current rating according to one embodiment.

FIG. 15 is a graph of a capacitance for a binary with overlap EVC according to one embodiment.

DETAILED DESCRIPTION

Figure 1:
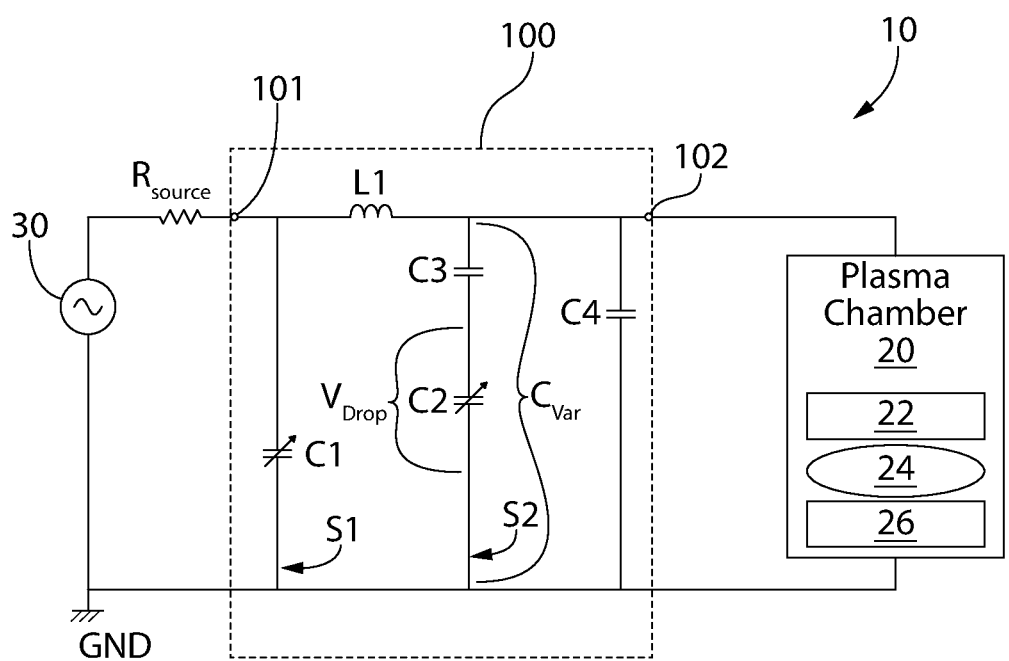
FIG. 1 is a system incorporating a pi matching network according to one embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present invention may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

Ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

Voltage Reduction Circuit

Referring now to FIG. 1, a system 10 incorporating a pi matching network 100 according to one embodiment is shown. In this embodiment, the system 10 is a system for manufacturing semiconductors. In other embodiments, the matching network can form part of any system attempting to match a source impedance to a load impedance to maximize power transfer to the load.

In the exemplified embodiment, the system 10 includes a radio frequency (RF) source 30 having a substantially fixed output impedance $R_{source}$ (e.g., 50 ohms). The RF source 30 generates an RF signal that is received at the input 101 of the matching network 100. The RF source 30 is also operably coupled to chassis ground GND. The RF source 30 may be an RF generator of a type that is well-known in the art to generate an RF signal at an appropriate frequency and power for the process performed within the load 20. The RF source 30 may be electrically connected to the RF input 101 of the impedance matching network 100 using a coaxial cable or similar means, which for impedance matching purposes may have the same fixed (or substantially fixed) impedance as the RF source 30.

The system 10 further includes a load. In the exemplified embodiment, the load is a plasma chamber 20 for manufacturing a semiconductor. The semiconductor device can be a microprocessor, a memory chip, or another type of integrated circuit or device.

As is known in the art, the plasma within a plasma chamber 20 typically undergoes certain fluctuations outside of operational control so that the impedance presented by the plasma chamber 20 is a variable impedance. Since the variable impedance of the plasma chamber 20 cannot be fully controlled, an impedance matching network may be used to create an impedance match between the plasma chamber 20 and the RF source 30. In other embodiments, the load can be any load of variable impedance that can utilize a matching network.

The plasma chamber 20 can include a first electrode 22 and a second electrode 26, and in processes that are well known in the art, the first and second electrodes, in conjunction with appropriate control systems (not shown) and the plasma in the plasma chamber 120, enable one or both of deposition of materials onto a substrate 24 and etching of materials from the substrate 24. The plasma chamber 20 can receive an RF signal from the output 102 of the matching network 100 and thereby receive RF power from the RF source 30 to energize plasma within the plasma chamber 20 to perform the deposition or etching.

The matching network 100 can consist of a single module within a single housing designed for electrical connection to the RF source 30 and plasma chamber 20. In other embodiments, the components of the matching network 100 can be located in different housings, some components can be outside of the housing, and/or some components can share a housing with a component outside the matching network 100.

The matching network 100 provides impedance matching for the RF source 30 and the plasma chamber 20. The matching network 100 is operably coupled between the RF source 30 and the plasma chamber 20. The matching network 100 includes an input 101 configured to operably couple to the RF source 30, and an output 102 configured to operably couple to the plasma chamber 20. The matching network 100 further includes a first variable capacitor C1 and a second variable capacitor C2. In a preferred embodiment, the variable capacitors C1, C2 are EVCs, though in other embodiments, other types of variable capacitors can be used, such as VVCs.

In this first embodiment, the matching network 100 is a pi network. The first variable capacitor C1 forms part of a first shunt S1 parallel to the RF source 30, and the second variable capacitor C2 forms part of a second shunt S2 separate from the first shunt S1. Put differently, the first variable capacitor C1 is parallel to the input 101, and the second variable capacitor C2 is parallel to the output 102. Further, a first inductor L1 is located between the first shunt S1 and the second shunt S2. In other embodiments, a second inductor L2 can be located between the second shunt S2 and the output 102.

The first variable capacitor C1 has a first capacitance, and the second variable capacitor C2 has a second capacitance. The first capacitance and the second capacitance are configured to be altered to create an impedance match at the input. As will be discussed further herein, however, the invention is not limited to pi matching networks, as other types of matching networks can be utilized.

To reduce a voltage on the second variable capacitor C2, the matching network 100 further includes a third capacitor C3 in series with the second variable capacitor C2. Components or nodes are said to be "in series" if the same current flows through each. In the exemplified embodiment, the third capacitor C3 forms part of the second shunt S2, though the invention is not so limited. In other embodiments, the third capacitor C3 can be at different locations, provided the third capacitor C3 is positioned to reduce a voltage on the second variable capacitor C2 (the reduced voltage being, for example, an alternating current or radio frequency voltage). For example, the positions of C2 and C3 in FIG. 1 can be reversed. Alternative embodiments are discussed below. In the embodiments discussed, the third or additional capacitor is a non-variable capacitor, though in other embodiments a variable capacitor can be used.

In the exemplified embodiment, a fourth capacitor C4 is included. The fourth capacitor C4 is parallel to the second shunt S2 and helps to offset the total capacitance. In other embodiments, the fourth capacitor C4 can be omitted.

Figure 2:
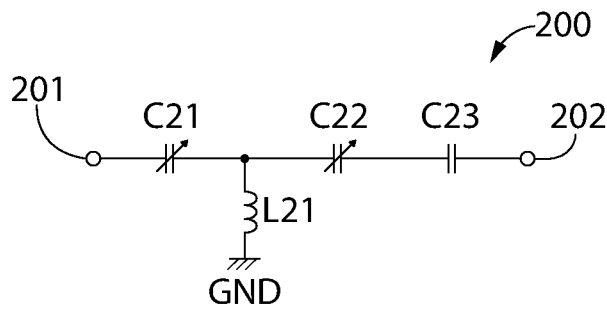
FIG. 2 is a T matching network according to one embodiment.

FIG. 2 is a T matching network 200 according to a second embodiment. The matching network 200 includes an input 201 configured to operably couple to an RF source and an output 202 configured to operably couple to a load. A first variable capacitor C21 is in series with the input 201, and a second variable capacitor C22 is in series with the output 202. An inductor L21 at one end is coupled at a node between the two variable capacitors C21, C22 and coupled at another end to chassis ground. As with the first embodiment, the third capacitor C23 is in series with the second variable capacitor C22 to reduce a voltage on the second variable capacitor C22.

Figure 3:
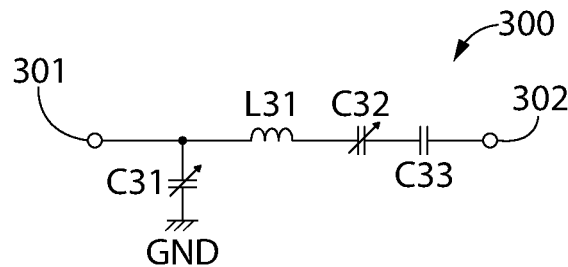
FIG. 3 is an L matching network according to one embodiment.

FIG. 3 is an L matching network 300 according to a third embodiment. The matching network 300 includes an input 301 configured to operably couple to an RF source and an output 302 configured to operably couple to a load. A first variable capacitor C31 is parallel to the input 301. Further, a second variable capacitor C32 is in series with the output 302. Further, an inductor L31 is in series with the output 302. As with the first embodiment, the third capacitor C33 is in series with the second variable capacitor C32 to reduce a voltage on the second variable capacitor C32.

Figure 4:
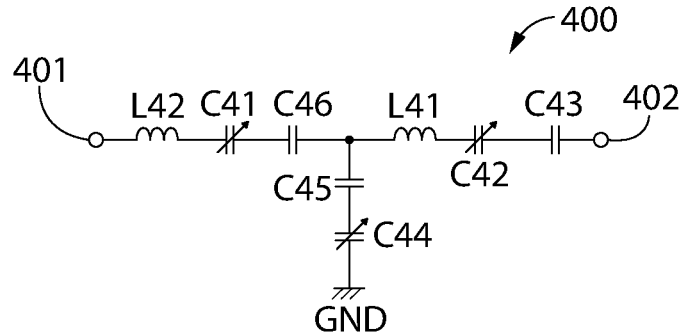
FIG. 4 is a T-variation matching network according to one embodiment.

FIG. 4 is a matching network 400 that is a variation on a T matching network according to a fourth embodiment. The matching network 400 includes an input 401 configured to operably couple to an RF source and an output 402 configured to operably couple to a load. A first variable capacitor C41 is in series with the input 401, a second variable capacitor C42 is in series with the output 202, and another variable capacitor C44 at one end is coupled at a node between the two variable capacitors C41, C42 and coupled at another end to chassis ground. Further, capacitor C46 is in series with capacitor C41, capacitor C43 is in series with capacitor C42, and capacitor C45 is in series with capacitor C44. An inductor L41 is in series with the output 402, and an inductor L42 is in series with the input 401. As with the first embodiment, the third capacitor C43 reduces a voltage on the second variable capacitor C42. Further, capacitors C41 and C45 reduce voltage on capacitors C46 and C44, respectively.

Figure 5:
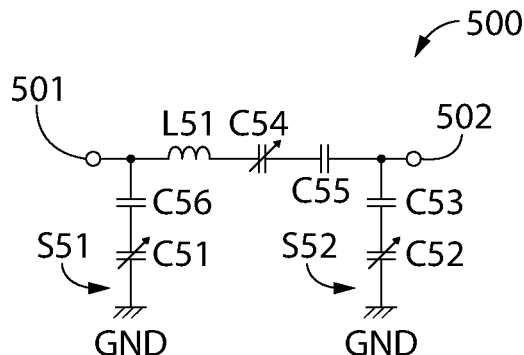
FIG. 5 is a pi-variation matching network according to one embodiment.

FIG. 5 is a matching network 500 that is a variation on a pi matching network according to a fifth embodiment. The matching network 500 includes an input 501 configured to operably couple to an RF source and an output 502 configured to operably couple to a load. A first variable capacitor C51 forms part of a first shunt S51 parallel to the input 501, a second variable capacitor C52 forms part of a second shunt S52 separate from and parallel to the output 502, and another variable capacitor C54 is located between variable capacitors C51 and C52. Capacitor C56 is in series with variable capacitor C51, capacitor C53 is in series with variable capacitor C52, and capacitor C55 is in series with variable capacitor C54. Further, a first inductor L51 is in series with variable capacitor C54. As with the first embodiment, the third capacitor C53 reduces a voltage on the second variable capacitor C52. Further, capacitors C55 and C56 reduce a voltage on variable capacitors C54 and C51, respectively.

Figure 6:
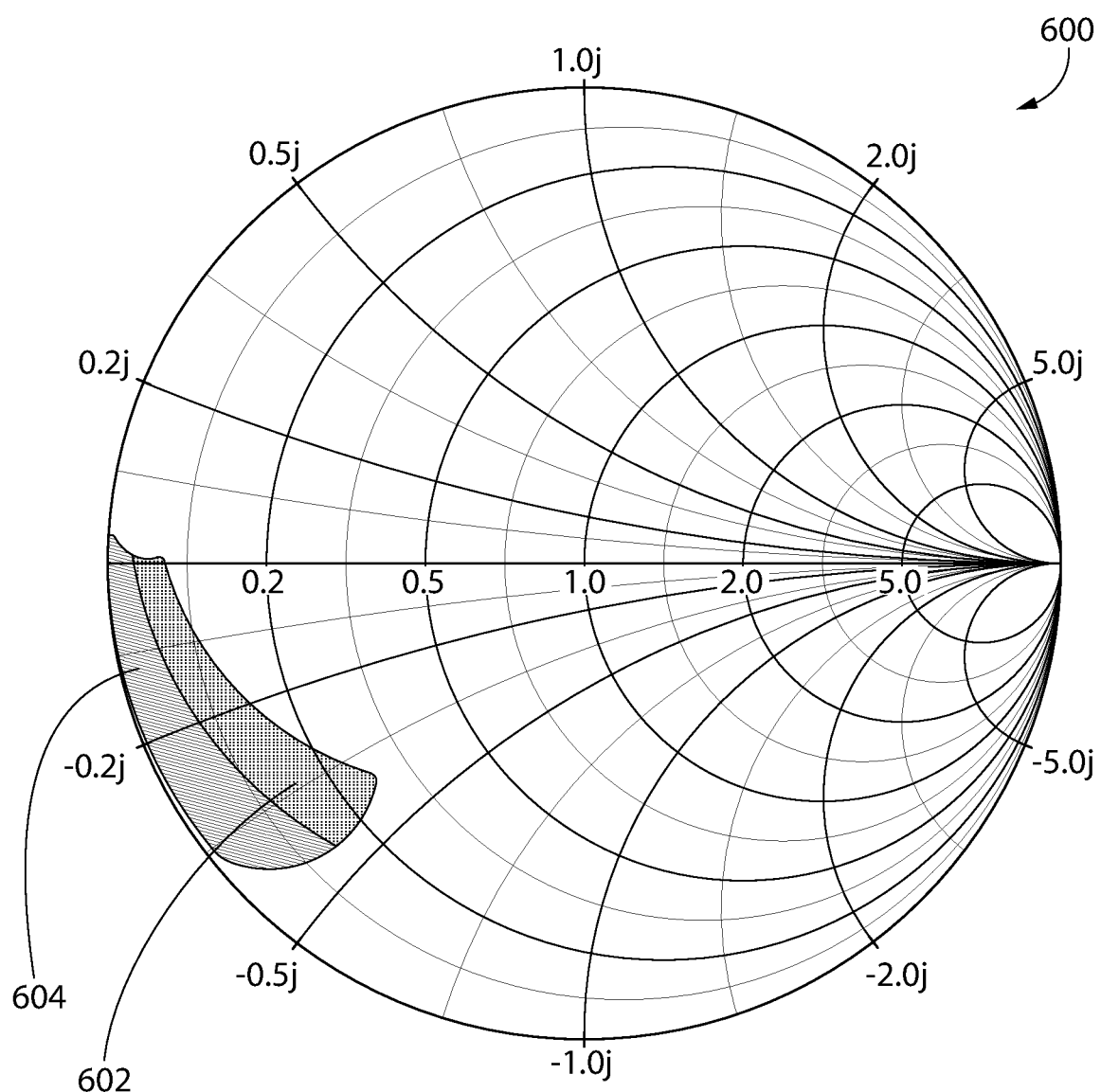
FIG. 6 is an impedance Smith chart for the pi matching network of FIG. 1 where capacitor C3 is omitted.

FIG. 6 shows an impedance Smith chart 600 for the matching network of FIG. 1 before the additional capacitor C3 is added. An impedance Smith chart shows the different possible impedances for a matching network. In FIG. 6, the first region 602 and the second region 604 together represent the total number of possible impedances. There is a maximum voltage across C2 (e.g., 1600V). The first region 601 represents the impedance range where the maximum voltage is not exceeded (within spec), and the second region 602 represents the impedance range where the maximum voltage is exceeded (out of spec). It can be seen that about half of the impedance range of the matching network cannot be used at full power due to over voltage.

In the embodiment discussed below, the values of the additional fixed capacitor C3 and variable capacitors C2 (see FIG. 1) are chosen to reduce the voltage $V_{Drop}$ on the variable capacitor C2 by half at the maximum capacitance (compared to the voltage on the variable capacitor C2 without the presence of the additional capacitor C3). This is only an example, and the voltage drop can be altered depending on the application, the desired voltage drop, and/or the availability of components.

The voltage drop $V_{Drop}$ across the variable capacitor C2 (see FIG. 1) can be calculated by the following equation:

$$V_{Drop} = V_{C2} * \frac{1}{C2} \bigg/ \left(\frac{1}{C2} + \frac{1}{C3}\right)$$

If $C2_{Max} = C3$, then the formula can be simplified as below, where $C2_{Max} = C3 = C$.

$$V_{Drop} = V_{C2} * \frac{1}{C} \bigg/ \left(\frac{1}{C} + \frac{1}{C}\right) = V_{C2} * 1/(1+1) = \frac{V_{C2}}{2}$$

As a result, $V_{Drop}$ is equal to half of the voltage that was originally capacitor C2 ($V_{C2}$) when C3 was not included.

$$V_{Drop} = \frac{V_{C2}}{2}$$

Continuing with this example, the next step is to find the maximum capacitance required for the variable and fixed capacitors. In this case, the total series capacitance CVar is equal to the maximum capacitance of the original variable capacitor C2. The capacitance CVar can be calculated by the following equation:

$$CVar_{Max} = \left(\frac{1}{C2_{Max}} + \frac{1}{C_3}\right)^{-1}$$

If $C2_{Max} = C3 = C$, the equation can be modified as follows:

$$\frac{1}{CVar_{Max}} = \left(\frac{1}{C} + \frac{1}{C}\right) = \frac{2}{C}$$

C is then solved for as follows:

$$C = 2 * CVar_{Max}$$

The minimum value for variable capacitor C2, $C2_{Min}$, can be found by using the previously calculated value for C3 and replacing the $CVar_{Max}$ with the minimum capacitance, $CVar_{Min}$, as in the following equations:

$$\frac{1}{C2_{Min}} = \left(\frac{1}{CVar_{Min}} - \frac{1}{C3}\right)$$

$$C2_{Min} = \left(\frac{1}{CVar_{Min}} - \frac{1}{C3}\right)^{-1}$$

Figure 7:
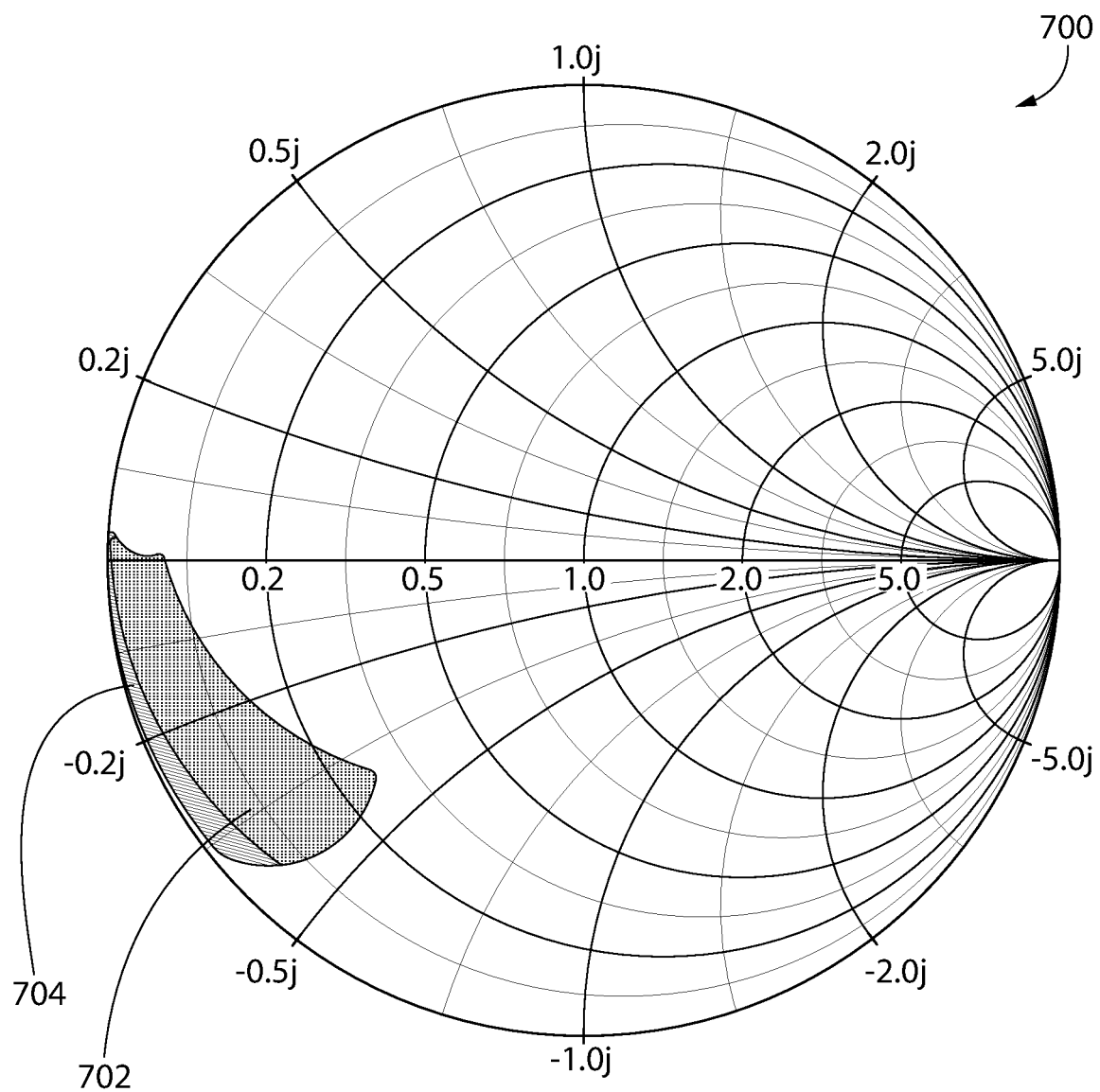
FIG. 7 is an impedance Smith chart for the pi matching network of FIG. 1 where $C3=C2_{Max}$.

FIG. 7 is an impedance Smith chart 700 where third capacitor C3 is set to the maximum capacitance of second capacitor C2 ($C3 = C2_{Max}$). It is shown that the usable range of the matching network (represented by first region 702) has been increased, and the unusable range (represented by second region 704) has been decreased, without sacrificing the impedance range, using a more expensive, larger, higher voltage component, or adding more peripheral components to meet the voltage requirements.

It can also be seen, however, that the first (usable) region 702 has gaps representing areas where a perfect impedance match is not provided. This can be a result of adding capacitor C3 to reduce the voltage, which increases the gap between the quantized states of the variable capacitor when approaching $C2_{Min}$ and decreased the spacing when approaching $C2_{Max}$.

Figure 8:
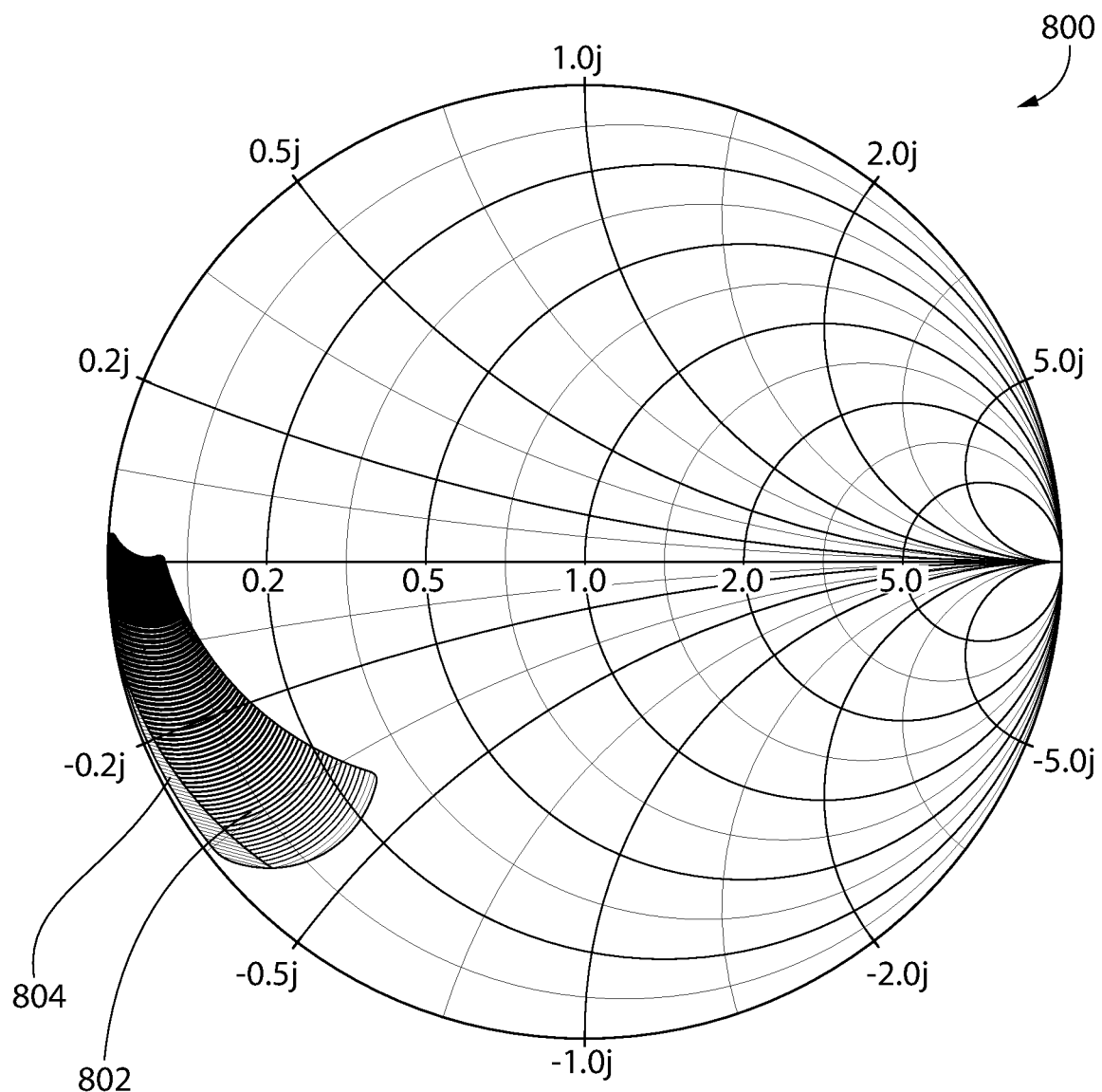
FIG. 8 is an impedance Smith chart for the pi matching network of FIG. 1 where $C3=C2_{Min}$.

FIG. 8 is an impedance Smith chart 800 where third capacitor C3 is set to the minimum capacitance of second capacitor C2 ($C3=C2_{Min}$). It is shown that such an arrangement can further increase the usable range (first region 802) of the matching network, and decrease the unusable range (second region 804). C3 can be reduced further, but there is a limit before it affects the maximum capacitance range. To avoid this, each of C3 and $C2_{Max}$ can be greater than $CVar_{Max}$. This is also true if using two or more variable capacitors in series. Thus, if C1 was replaced with C15 and C16, then $C15_{Max}$ and $C16_{Max}$ can be selected to each be greater than $C1_{Max}$. $C1_{Max}$ can be calculated using the following equation:

$$C1_{Max} = \left(\frac{1}{C15_{Max}} + \frac{1}{C16_{Max}}\right)^{-1}$$

Figure 9:
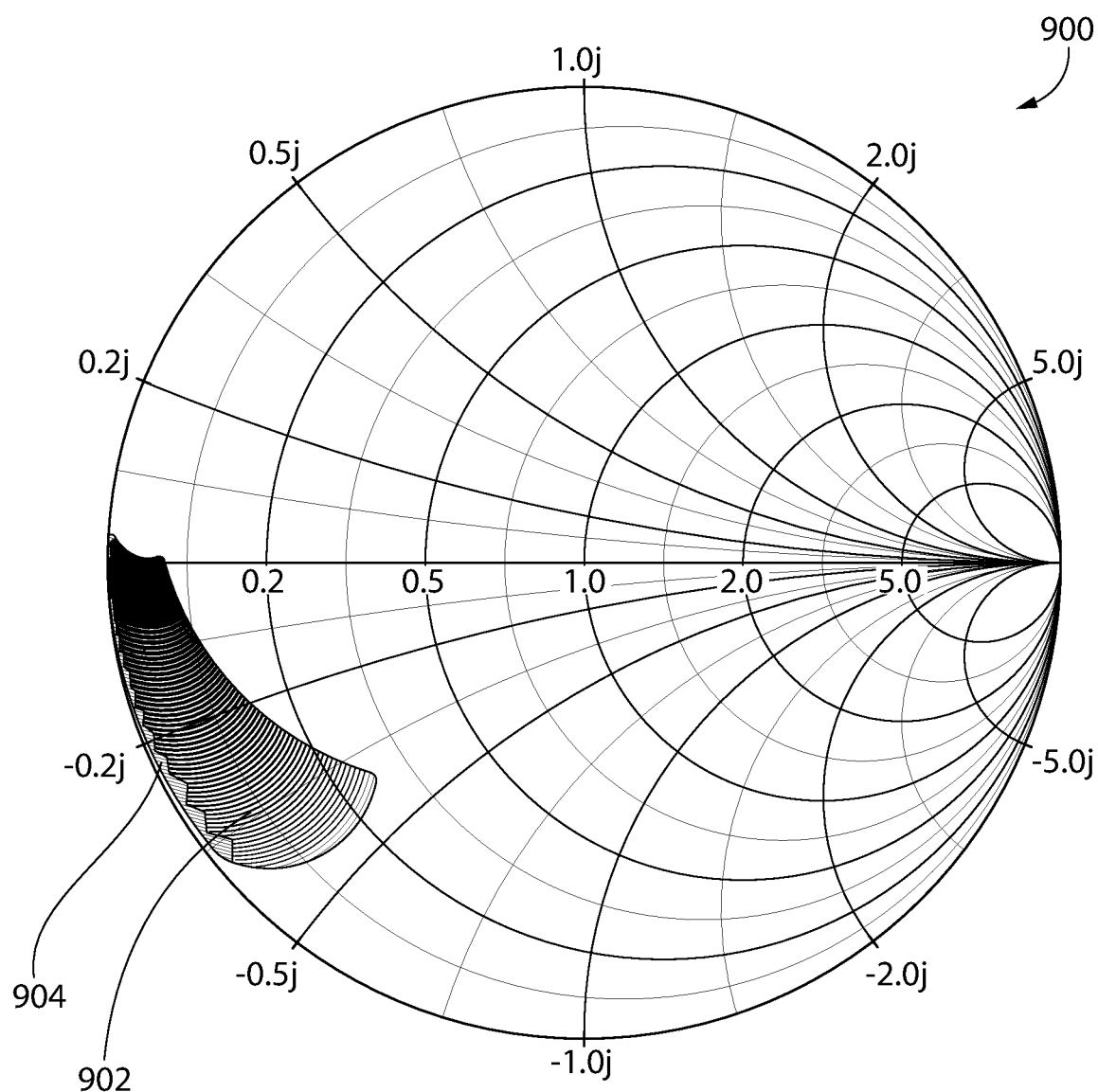
FIG. 9 is an impedance Smith chart for the pi matching network of FIG. 1 where C3 is replaced with a variable capacitor.

The addition of a third variable or non-variable capacitor, to help further reduce $V_{Drop}$, can change the capacitor range of the variable capacitor combination C2. To address this, a variable capacitor such as an EVC can be easily modified to adjust the capacitor range. The third capacitor can also change the step sizes and make them nonlinear. In certain embodiments, a more uniform distribution can be provided by using a nonlinear variable capacitor or multiple variable capacitors in series. FIG. 9 is an impedance Smith chart 900 where the third capacitor C3 is replaced with a variable capacitor. This figure shows the usable range (first region 902) of the matching network, and the unusable range (second region 904).

In other embodiments, transmission lines (which can comprise microstrips, coaxial cable, a wave guide, or any other conductive medium) can be used to rotate the impedance of the matching network on the Smith chart. The length of the transmission line at a certain frequency determines the amount of rotation. The longer the transmission line, the more rotation there will be on the Smith chart. A quarter wavelength ($\lambda/4$) transmission line (which can be calculated using the operating frequency and the property of the dielectric material) will have a 180° clockwise rotation on the Smith chart, a half wavelength ($\lambda/2$) transmission line will have a 360° clockwise rotation on the Smith chart, an eighth wavelength ($\lambda/8$) would be equal to 450, and so on.

Figure 10:
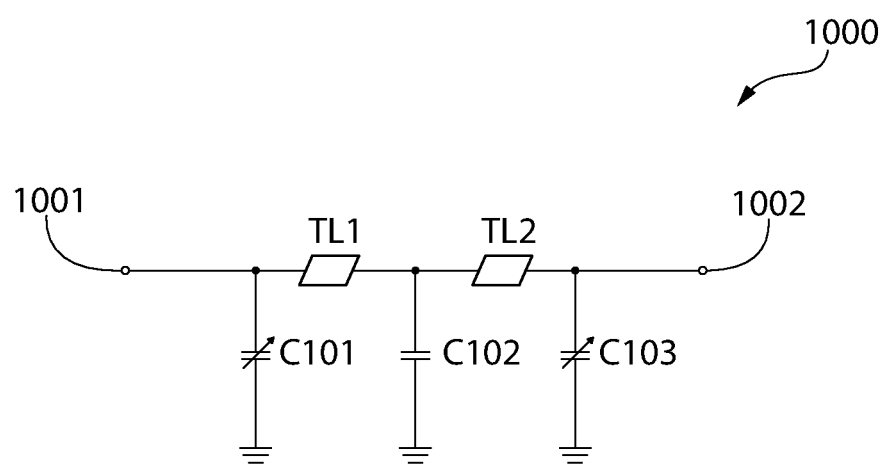
FIG. 10 is matching network using transmission lines to rotate the impedance.

If the matching network 1000 uses only quarter wave lines, or something that would ultimately give a 90° phase shift [$(\lambda/4)+N*(\lambda/2)$], and there are the three capacitors C101, C102, C103 in shunt (together with transmission lines TL1 and TL2), as shown in FIG. 10, the circuit can be equivalent to a low pass pi matching network, with input 1001 and output 1002. Two variable capacitors can be used with a single transmission line between to create the equivalent of an L-type matching network (e.g., C101-TL1-C102 of FIG. 10). Transmission lines can then be added to the input port, the output port or both ports to create the equivalent inverse network of the two previously mentioned matching networks. In other embodiments, other topologies can be created with other transmission lines.

Figure 11:
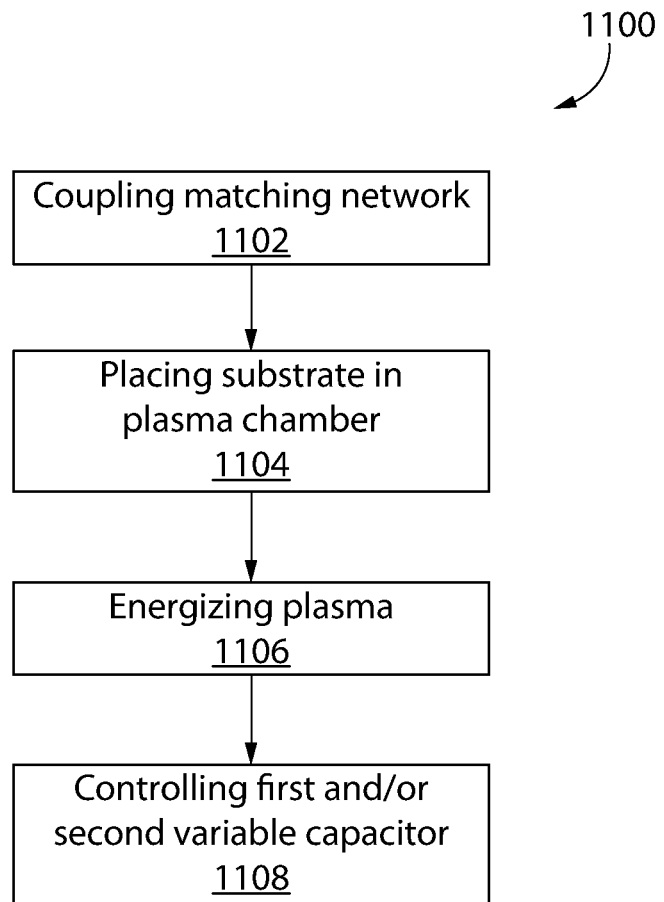
FIG. 11 is a flowchart of a method of manufacturing a semiconductor according to one embodiment.

FIG. 11 is a flowchart of a method 1100 of manufacturing a semiconductor according to one embodiment. In the exemplified embodiment, a matching network is operably coupled between an RF source and a plasma chamber (operation 1102), as in the embodiment of the system 10 shown in FIG. 1. The matching network can be configured to have the features of any of the embodiments discussed herein. Further, the method 1100 can include placing a substrate in the plasma chamber (operation 1104). Further, the method 1100 can include energizing plasma within the plasma chamber by coupling RF power from the RF source into the plasma chamber to perform a deposition or etching (operation 1106). Further, the method 1100 can include controlling a capacitance of the first variable capacitor and/or the second variable capacitor to achieve an impedance match (operation 1108).

The foregoing embodiments provide several advantages. The embodiments disclose a matching network that can more effectively handle high voltages generated in a network. Further, the embodiments avoid or minimize the need for increased component sizes (as typically required for a VVC) or increased numbers of peripheral components (as typically required with an EVC). Further, the embodiments provide a solution that has a lower cost than previous methods of addressing high voltages in a matching network. As shown herein, the embodiments can increase the usable range of a matching network without sacrificing the impedance range, using a more expensive, larger, higher voltage component, or adding more peripheral components to meet the voltage requirements.

Capacitance Variation

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of various methods for setting up an EVC or other variable capacitor to provide varying capacitances.

In an accumulative setup of an EVC, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switch in, and the fine tune capacitors are switched out. The process starts over with increasing the number of fine tune capacitors that are switched into circuit, until all fine and coarse tune capacitors are switched in. In this setup, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance.

An example of this in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system.

FIG. 12 is a graph 1 of capacitance for an accumulative EVC according to one embodiment. The graph 1 shows the capacitor percentage versus the capacitor value. In this embodiment, there are 12 coarse tune capacitors, each equal to 36 pF, and 12 fine tune capacitors, each equal to 3.3 pF. The switch is assumed to have a parasitic capacitance of 0.67 pF each. With parasitic capacitance from the switches added in series with each capacitor, the range of the EVC is 14.5 pF (all switches open) to 471.6 pF (all switches closed) and it has 169 unique capacitor values.

An alternative capacitor setup is referred to herein as a binary weighted setup. In the binary weighted setup, the capacitor values will all be different. The first value is equal to the minimum desired change in capacitance. Then each successive capacitor value is increased to double the change in capacitance from the previous up until the maximum desired capacitor value, when all capacitors are switched in.

In one example (that assumes there are no parasitic capacitances), the lowest capacitance capacitor would be a 1 pF capacitor, followed by 2 pF, 4 pF, and so on. When all switches are open, the value is 0 pF. When the 1 pF capacitor is switched in, the EVC total capacitance value is 1 pF. Then the 1 pF capacitor is switched out of circuit and the 2 pF capacitor is switched in, causing a total capacitance of 2 pF. When 3 pF is needed, the 1 pF and the 2 pF capacitors are switched in. For 4 pF, the 1 and 2 pF capacitors are switched out of circuit and the 4 pF capacitor is switched into circuit. This can be repeated adding 1 pF, 2 pF, and 4 pF together in different combinations in the circuit, creating values of 5 pF, 6 pF and 7 pF.

FIG. 13 is a graph 2 of a capacitance for a binary weighted EVC according to one embodiment. As with FIGS. 12 and 14-15, this graph 2 shows the capacitor percentage versus the capacitor value. As used herein, the term "capacitor percentage" refers to the amount of capacitance switched in as a portion of the total potential capacitance. For example, if a binary weighted system has capacitor values 1 pF, 2 pF, and 4 pF, the capacitor percentage would be 0% when all the capacitors are switched out of circuit, and 100% when all the capacitors are switched in. If the 1 pF and 4 pF capacitors are switched in, the capacitor percentage would be 5 pF/7 pF, or 71.4%.

In the embodiment of FIG. 13, the capacitors from lowest to highest value are 3.0 pF, 5.1 pF, 9.1 pF, 18 pF, 36 pF, 75 pF, 150 pF and 300 pF. Again, the switch is assumed to have a parasitic capacitance of 0.67 pF each. With parasitic capacitance from the switches added in series with each capacitor, the capacitors provide a change in capacitance from switch open to switch closed, of 2.45 pF, 4.51 pF, 8.48 pF, 17.4 pF, 35.3 pF, 74.3 pF, 149 pF and 299 pF. The EVC capacitor ranges from 5.04 pF to 596.2 pF, with 256 unique capacitor values.

The binary weighted setup can result in using far less capacitors to switch in and out of circuit to achieve the same or better resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value.

FIG. 14 is a graph 3 of current versus current rating according to one embodiment. This graph 3 shows the current 3A against the current ratings 3B of a certain group of capacitors. The increase in current 3A versus the current rating 3B is not proportional and only gets worse as the capacitor value is increased. The capacitors up to 36 pF meet the specification, while the values above do not. In the accumulated method there are no issues, but in the binary weighted method it is better to instead use two 36 pF capacitors in parallel rather than one 75 pF capacitor.

Another potential disadvantage of the binary weighted setup is that it is difficult to achieve a consistent step size throughout the range. The above capacitor values for the binary setup give an average step size of 2.32 pF, compared to the accumulative method, which has an average step size of 2.72 pF. But the minimum and maximum step for the binary weighted setup is 1.51 pF and 7.51 pF, respectively, while the accumulative setup's minimum and maximum are only 2.4 pF and 2.75 pF.

With higher value capacitors, this can be further complicated with finding a value that does not overshoot multiple steps. Also, part-to-part tolerances being greater than the minimum step size can further increase the gaps. A 300 pF capacitor with a ±5% tolerance can have up to 15 pF of extra capacitance. The delta capacitance of the three least significant binary weighted capacitors total 15.44 pF. So, these values are completely overstepped, and linearity is lost.

One modification to the binary weighted setup is to have the larger capacitor values rounded down to the next standard value, for example 3.0 pF, 5.1 pF, 9.1 pF, 18 pF, 36 pF, 68 pF, 130 pF, 240 pF. Doing this would create some overlap in capacitor value where there would be a drop in capacitance when switching in the new larger value and switching out the previous smaller values. For example, the values 3 pF through 36 pF would combine to equal 71.2 pF, but the next step is 68 pF, a drop of 3.2 pF. This problem can be avoided, however, because the EVC does not need to go sequentially through each step, but instead can use software to lookup the next known capacitor position to switch to it directly.

FIG. 15 is a graph 4 of a capacitance for a binary with overlap EVC according to one embodiment. As can be observed, this graph 4 shows how the overlap helps create a smooth increase in capacitance.

Figure 16:
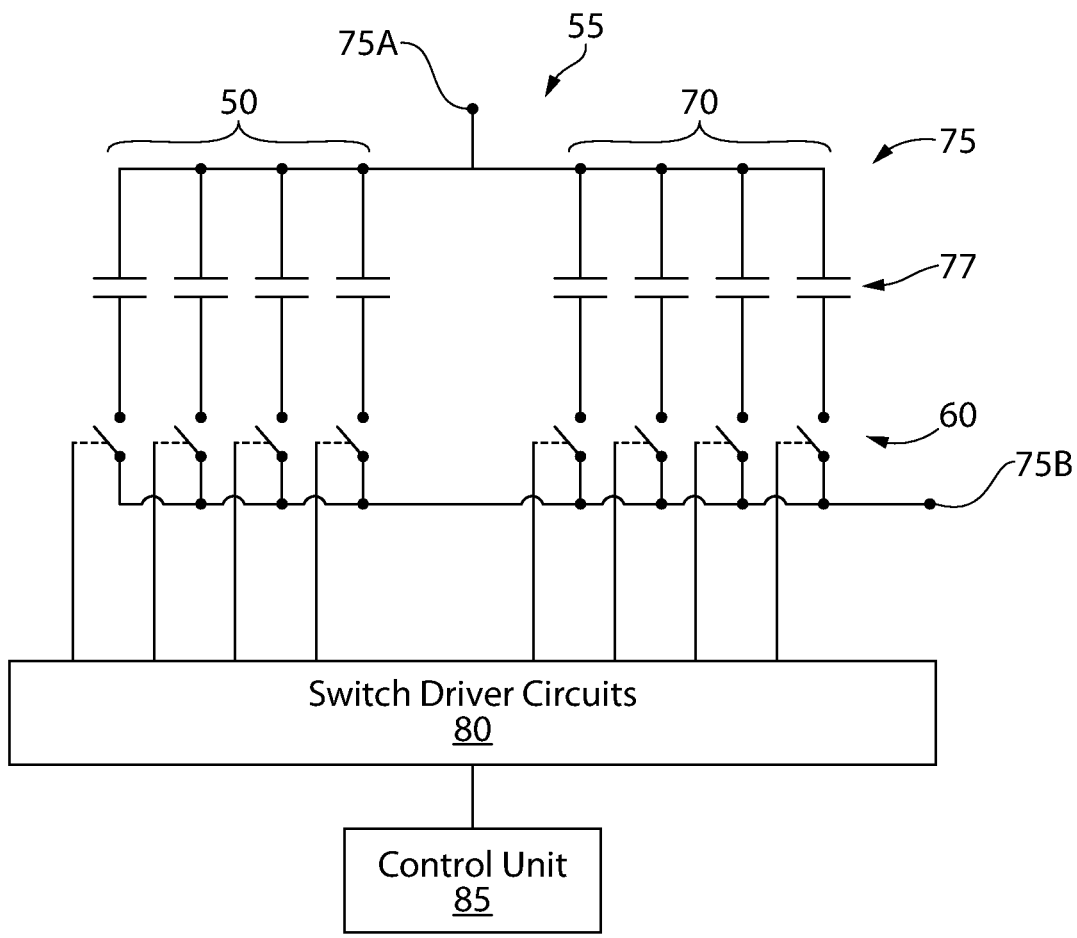
FIG. 16 is a schematic of a variable capacitance system according to one embodiment.

FIG. 16 is a schematic of a variable capacitance system 55 according to a partial binary setup. The partial binary setup uses attributes of both the accumulative and binary setups. The variable capacitance system 55 comprises a variable capacitor 75 (such as an EVC or a VVC) for providing a varying capacitance. The variable capacitor 75 has an input 75A and an output 75B. The variable capacitor 75 includes a plurality of capacitors 77 operably coupled in parallel. The plurality of capacitors 77 includes first capacitors 50 and second capacitors 70. Further, the variable capacitor 75 includes a plurality of switches 60. Of the switches 60, one switch is operably coupled in series to each of the plurality of capacitors to switch in and out each capacitor, thereby enabling the variable capacitor 75 to provide varying total capacitances.

The switches 60 can be coupled to switch driver circuits 80 for driving the switches on and off. The variable capacitance system 55 can further include a control unit 85 operably coupled to the driver circuits 80 for instructing the driver circuits 80 to switch one or more of the switches 60, and thereby turn one or more of the capacitors 77 on or off. In one embodiment, the control unit 85 can form part of a control unit that controls variable capacitor, such as a control unit that instruct the variable capacitors of a matching network to change capacitances to achieve an impedance match.

In the exemplified embodiment, the first capacitors 50 are fine tune capacitors using a method similar to the binary method discussed above. Thus, the fine tune capacitors 50 can have capacitances increasing by a factor of about two, where "about two" refers to a value of 1.5 to 2.5. In an ideal example where there are no parasitic capacitances, the fine tune capacitors could increase by a factor of exactly two (e.g., 1 pF, 2 pF, 4 pF, 8 pF).

But in real world applications, parasitic capacitances, such as those provided by the switches 60, are another factor that must be considered in choosing the capacitance values of the fine tune capacitors 50. Thus, while a first capacitor may have a value of 1 pF, and the corresponding capacitor-switch pair may thus provide 1 pF to a total capacitance of the variable capacitor when the capacitor's corresponding switch is closed, when the switch is open, the open switch may have a parasitic capacitance of, for example, 1 pF. Thus, when the switch is open, there are essentially two 1 pF capacitances in series, which is equivalent to 0.5 pF. Thus, when the first fine tune capacitor switch switches from open to close, the change in the capacitance contributed to the variable capacitor by this capacitor-switch pair is from 0.5 pF (open) to 1 pF (closed), for a change of 0.5 pF. These changes in capacitance caused by parasitic capacitances must be taken into consideration in choosing capacitor values to ensure that the target step size (e.g., 0.5 pF) for the total capacitance can be achieved.

Returning to the previous example, if an EVC had four fine capacitors, and each capacitor switch had a parasitic capacitance of 1 pF, and a step size of 0.5 pF was desired, the fine capacitors could be 1 pF, 1.6 pF, 2.7 pF, and 4.7 pF. As discussed, the first fine capacitor (1 pF) would cause a 0.5 pF change to the total capacitance when switched in. The second fine tune capacitor (1.6 pF) and its switch would provide 0.6 pF when open and 1.6 pF when closed, thus causing a change in the total capacitance of about 1 pF when switched in. The third fine tune capacitor (2.7 pF) would cause a change in the total capacitance of about 2 pF when switched in, and the fourth fine tune capacitor (4.8 pF) would cause a change in the total capacitance of about 4 pF when switched in. Thus, the changes to the total capacitance caused by the switching in of each of the four first tune capacitors would be 0.5 pF, 1 pF, 2 pF, and 4 pF, respectively. Thus, the changes caused by the switching in of each of these capacitors increases by a factor of two. It is understood that the invention is not limited to these values. Other capacitor values (or switches with other parasitic capacitances) can be used such that the changes caused increase by a factor of about two. For example, the 4.8 pF capacitor of the above example could be replaced with a standard 4.7 pF capacitor. Further, other capacitance values can be used to achieve other step sizes. The foregoing considerations regarding parasitic capacitances can equally apply to the binary setup discussed above.

The second capacitors 70, by contrast, are coarse tune capacitors using a method similar to the accumulative method discussed above. Thus, the second capacitors can have a substantially similar capacitance. Capacitors are considered to have substantially similar capacitances if, of the capacitors in question, no capacitance is 15 percent (15%) greater than or less than another capacitance. Alternatively, the capacitors can be chosen such that there are no gaps in total capacitance greater than the minimum step size needed for the given application.

The first (fine) capacitors 50 can increase their value (or the value by which they change the total capacitance) in a binary fashion, and thus by a factor of about two, up to the first coarse position. When all of the fine capacitors 50 are switched into circuit, the first coarse capacitor 71 can be switched in, and all the fine capacitors 50 are switched out. Then the fine capacitors 50 can be switched in and out until they are all switched into circuit. The next step would be to add another coarse tune capacitor 72. It is understood, however, that the EVC does not need to go sequentially through each step to achieve a desired total capacitance, but instead can use software to lookup the next known capacitor position to switch to it directly.

In one embodiment, there are four fine capacitors 50. The first fine capacitor 51 has a capacitance of 3.0 pF, the second fine capacitor 52 has a capacitance of 5.1 pF, the third fine capacitor 53 has a capacitance of 9.1 pF, and the fourth fine capacitor has a capacitance of 18 pF. Further, there are four coarse tune capacitors 70 having capacitances of 36 pF each. Thus, in this embodiment, the total combined capacitance of the fine capacitors (35.2 pF) is substantially similar to the individual capacitances of the coarse capacitors (36 pF). It also follows that the capacitance of each of the coarse capacitors is greater than a greatest individual capacitance (18 pF) of the fine capacitors.

In this embodiment, there will be 208 unique capacitor values. With parasitics, the minimum total capacitance is 10.25 pF and the maximum total capacitance is 467.2 pF. The range is less than 1 pF less than the accumulative method, but with an increase in unique points. The minimum step size is 1.51 pF, the maximum is 2.54 pF and the average is 2.21 pF. Thus, the results of the setups discussed are as follows:

TABLE 1

Comparison of EVC Setups

|  | Accumulative | Binary Weighted | Partial Binary |
|---|---|---|---|
| Min total capacitance | 14.5 pF | 5.05 pF | 10.25 pF |
| Max total capacitance | 471.6 pF | 596.2 pF | 467.2 pF |
| Min and max step size | 2.4-2.75 pF | 1.51-7.51 pF | 1.51-2.54 pF |
| Unique capacitor values | 169 | 256 | 208 |

Figure 17:
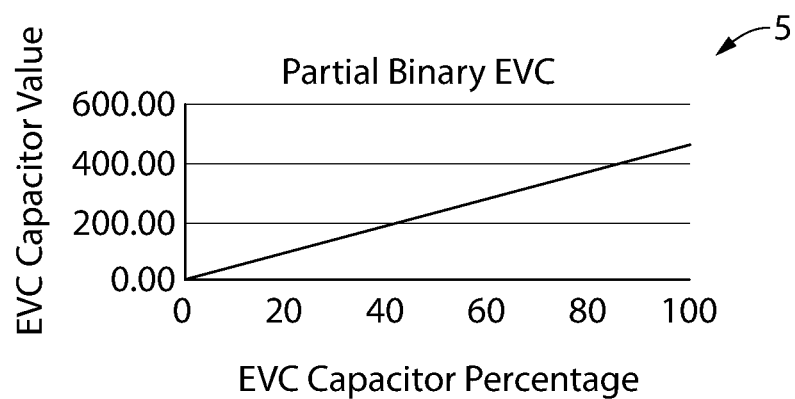
FIG. 17 is a graph of a capacitance of a partial binary EVC according to one embodiment.

FIG. 17 is a graph 5 of a capacitance of a partial binary EVC according to one embodiment. The graph shows the capacitor percentage versus the EVC total capacitance for the partial binary method for switching. As can be seen, this setup provides a smooth line for providing the various total capacitances required while also providing a large range.

The partial binary method provides multiple advantages. First, the current on each capacitor will not be over its rating. The maximum current and the current rating will be the same for all coarse capacitors, because they will be the same value. With the fine steps, all of the capacitor values have a higher ratio of current rating to maximum current. Therefore, no issues should arise.

Further, the partial binary approach avoids large gaps in capacitance steps. Further, less capacitors are needed to have the same range, while the number of unique values can potentially be increased. With less capacitors, the EVC will need less switches, causing the EVC to take up less area. Further, less capacitors will require less hardware to control the switches.

Binary with overlap can also be implemented in this setup to avoid any issues with part tolerance if required. Thus, the coarse capacitor values could be reduced in capacitance. It is further understood that, while the exemplified embodiment uses four first capacitors 50 and four second capacitors 70, other numbers of capacitors can be used. Also, other capacitor values can be used.

Figure 18:
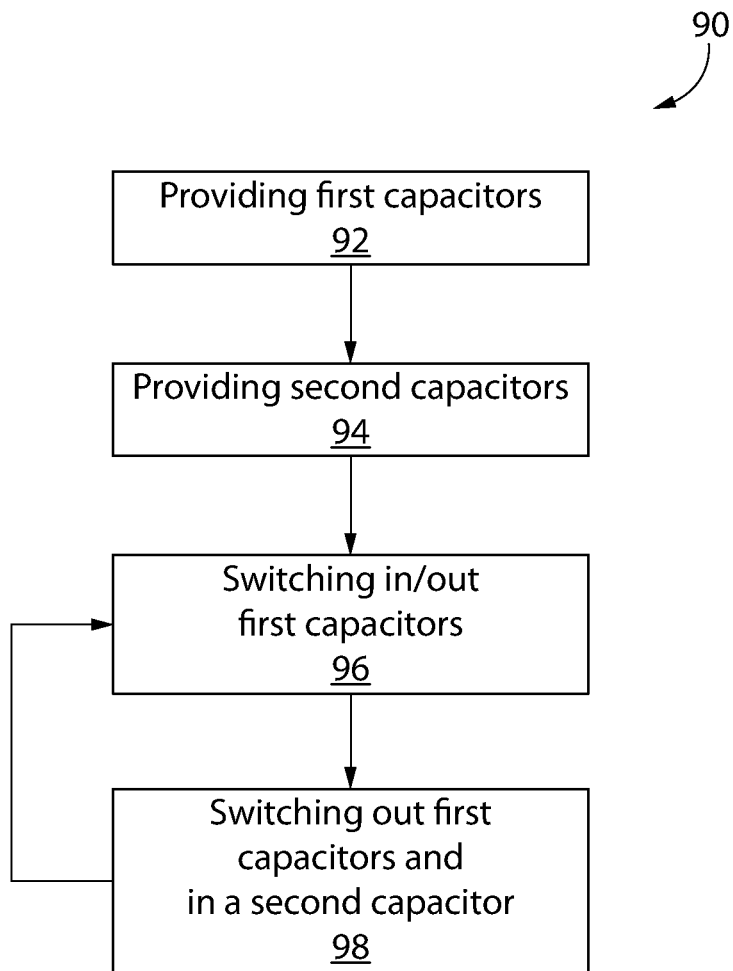
FIG. 18 is a flow chart of a method for varying capacitance according to one embodiment.

FIG. 18 is a flow chart of a method for varying capacitance according to one embodiment. According to this embodiment, there is provided a plurality of capacitors operably coupled in parallel, the plurality of capacitors comprising first capacitors increasing in capacitance by a factor of about two (operation 92); and second capacitors having substantially the same capacitance (operation 94). The total capacitance can be varied by switching in or out one of the first capacitors and one of the second capacitors. Increasing total capacitance can be provided by switching in and out each of the first capacitors to provide an increasing total capacitance until all of the first capacitors are switched in (operation 96), then switching out the first capacitors and switching in a second capacitor (operation 98). If increasing total capacitance is desired, the system can again switch in and out each of the first capacitors to provide an increasing total capacitance until all of the first capacitors are switched in (operation 98).

It is understood, however, that the EVC does not need to go sequentially through each step, but instead can use software to lookup the next known capacitor position to switch to it directly. It is further understood that a desired total capacitance can be achieved by having switched on a minimal number of capacitors of the plurality of capacitors.

In another embodiment, the variable capacitor can for part of a method of manufacturing a semiconductor, such as the system displayed shown in FIG. 1. The method can include operably coupling a matching network between an RF source and a plasma chamber, the plasma chamber configured to deposit a material layer onto the substrate or etch a material layer from the substrate. The matching network can include an input configured to operably couple to the RF source; an output configured to operably couple to the plasma chamber; and a variable capacitor, the variable capacitor comprising a plurality of capacitors operably coupled in parallel, the plurality of capacitors comprising first capacitors increasing in capacitance by a factor of about two; and second capacitors having substantially the same capacitance. The method can further include the steps of placing a substrate in the plasma chamber; energizing plasma within the plasma chamber by coupling RF power from the RF source into the plasma chamber to perform a deposition or etching; and controlling a total capacitance of the variable capacitor to achieve an impedance match, the total capacitance being controlled by switching in and out capacitors of the plurality of capacitors.

Restricted Partial Binary Capacitor Switching

Figure 18A:
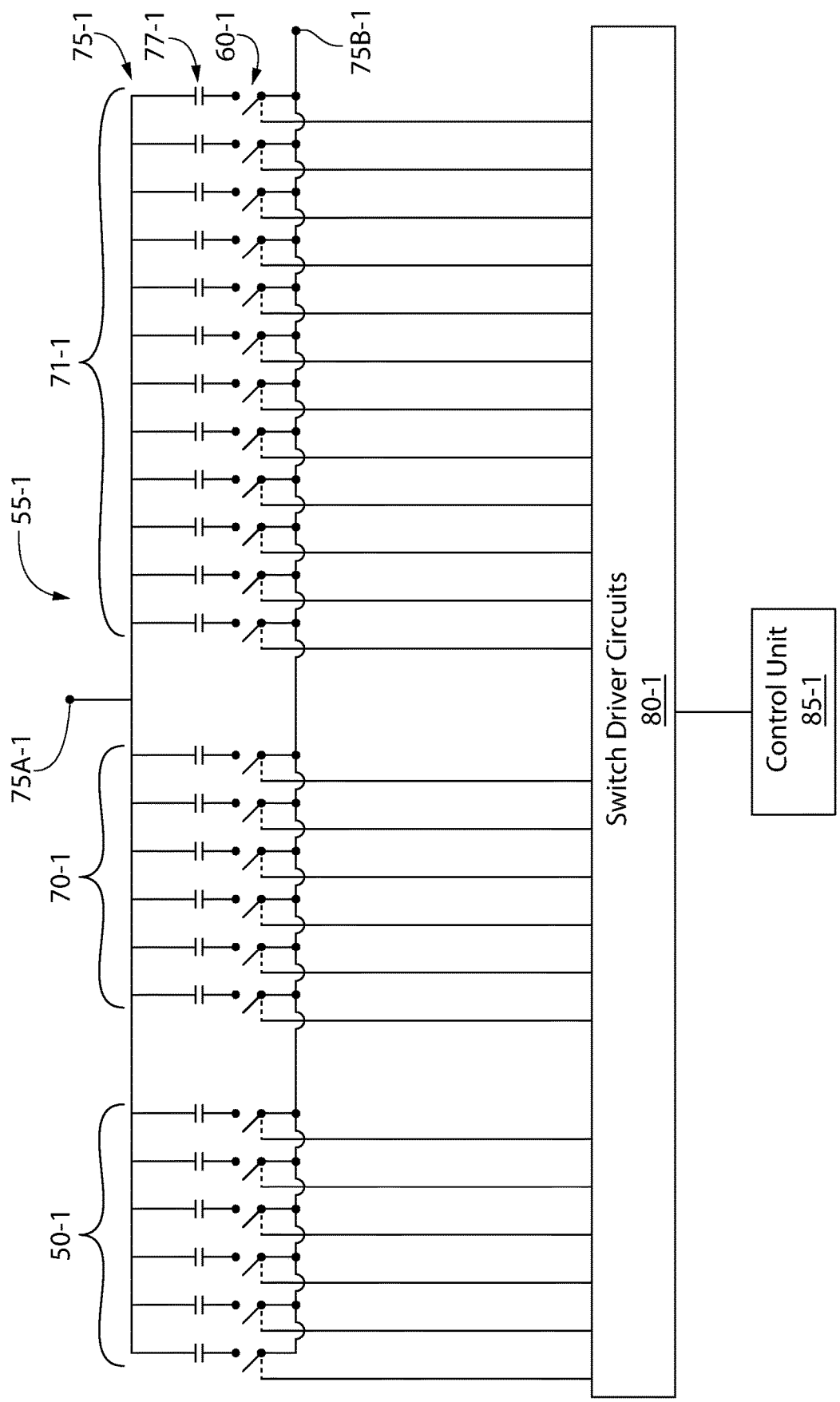
FIG. 18A is a schematic of a restricted partial binary variable capacitance system according to one embodiment.

FIG. 18A is a schematic of a restricted partial binary variable capacitance system 55-1 according to one embodiment. This method uses a partial binary setup similar to that discussed above, but where one or more fine capacitors are restricted from switching in under certain circumstances to be described below ("restricted partial binary setup"). The variable capacitance system 55-1 comprises a variable capacitor 75-1 (such as an EVC) for providing a varying capacitance. The variable capacitor 75-1 has an input 75A-1 and an output 75B-1. The variable capacitor 75-1 includes a plurality of capacitors 77-1 operably coupled in parallel. The plurality of capacitors 77-1 includes fine capacitors 50-1, first coarse capacitors 70-1, and second coarse capacitors 71-1. Further, the variable capacitor 75-1 includes a plurality of switches 60-1. Of the switches 60-1, one switch is operably coupled in series to each of the plurality of capacitors to switch in and out each capacitor, thereby enabling the variable capacitor 75-1 to provide varying total capacitances.

The switches 60-1 can be coupled to switch driver circuits 80-1 for driving the switches on and off. The variable capacitance system 55-1 can further include a control unit 85-1 operably coupled to the driver circuits 80-1 for instructing the driver circuits 80-1 to switch one or more of the switches 60-1, and thereby turn one or more of the capacitors 77-1 on or off. In one embodiment, the control unit 85-1 can form part of a control unit for a matching network that controls the capacitances of one or more variable capacitors of the matching network to achieve an impedance match. In the exemplified embodiment, the control unit 85-1 (sometimes referred to as "control circuit") is configured to (a) determine which of the coarse capacitors and the fine capacitors to have switched in to achieve an impedance match and (b) cause the determined coarse and fine capacitors to be switched in. This can be based on a determination, by the control unit or otherwise, of the variable impedance of the plasma chamber. The invention is not so limited, however, as the determination of the capacitors to switch in can be based on other factors, such as an input impedance at the input of the matching network.

In the exemplified embodiment, the fine capacitors 50-1 have capacitances increasing by a factor of about two, where "about two" refers to a value of 1.5 to 2.5, though the invention is not so limited and the fine capacitors can increase in value in another manner. In an ideal example where there are no parasitic capacitances, the fine tune capacitors could increase by a factor of exactly two (e.g., 1 pF, 2 pF, 4 pF, 8 pF, etc.). But as discussed above, in real world applications parasitic capacitances, such as those provided by the switches 60-1, are another factor that must be considered in choosing the capacitance values of the fine tune capacitors 50-1. In the exemplified embodiment, the fine capacitors 50-1 have values of 47 pF, 91 pF, 180 pF, 390 pF, 750 pF, 1500 pF, though the invention is not limited to these values or this number of capacitors.

According to the restricted partial binary setup, the coarse capacitors are made up of first coarse capacitors 70-1 each having a substantially similar first coarse capacitance, and second coarse capacitors 71-1 each having a substantially similar second coarse capacitance. Capacitors are considered to have substantially similar capacitances if, of the capacitors in question, no capacitance is 15 percent (15%) greater than or less than another capacitance. In the exemplified embodiment, there are 6 first coarse capacitors 70-1 each having a capacitance of 1000 pF, and 12 second coarse capacitors 71-1 each having a capacitance of 3000 pF. Thus, in the exemplified embodiment, one of the fine capacitors (the 1500 pF fine capacitor) has a capacitance greater than the first coarse capacitance of 1000 pF. In other embodiments, more than one of the fine capacitors can have a capacitance greater than the first coarse capacitance. Further, in other embodiments other values and other numbers of coarse capacitors can be used.

Each capacitor of the plurality of capacitors 77-1 provides a change to a total capacitance of the variable capacitor 75-1 when the capacitor is switched in. To gradually increase the total capacitance of the variable capacitor 75-1, the control unit 85-1 can successively switch in, in a predetermined order, each of the first coarse capacitors 70-1, followed by each of the second coarse capacitors 71-1. As for the fine capacitors 50-1, the control unit restricts which fine capacitors can be switched in. That is, it only switches in the fine capacitors 50-1 whose capacitance is less than a capacitance of a next coarse capacitor of the coarse capacitors predetermined to be switched in next.

As discussed above, in the exemplified embodiment, the fine capacitors 50-1 have capacitances substantially equal to 47 pF, 91 pF, 180 pF, 390 pF, 750 pF, 1500 pF; the first coarse capacitors 70-1 comprise six capacitors having capacitances substantially equal to 1000 pF; and the second coarse capacitors 71-1 comprise twelve capacitors having capacitances substantially equal to 3000 pF. To gradually increase capacitance, the fine capacitors can be switched into the circuit in a binary fashion as described above except for the 1500 pF fine capacitor, which is restricted from switching in until all the first coarse capacitors are switched in. When all the 1000 pF first coarse capacitors are switched in, the next coarse capacitor to be switched in is a 3000 pF second coarse capacitor. Thus, once all the 1000 pF first coarse capacitors are switched in, the 1500 pF fine capacitor is able to switch in with the rest of the fine capacitors.

Table 3 below shows the first 167 positions ("Pos.") for a variable capacitor using the restricted partial binary setup. The total capacitance ("Total Cap.") for each position is shown, along with the fine capacitors (F1-F6) and first coarse capacitors (C1-C6) switched in for a given position. As can be seen, although the fine capacitors switch in in a somewhat typical binary fashion, the 1500 pF fine capacitor is not able to switch in until position 165, when all of the first coarse capacitors have been switched in.

TABLE 3

| | | | | | | | | | | | | | |
|---|---|---|---|---|---|---|---|---|---|---|---|---|---|
| | | | | | Restricted Partial Binary Values | | | | | | | | |
| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
| 1 | 0 | | | | | | | | | | | | |
| 2 | 47 | 47 | | | | | | | | | | | |
| 3 | 91 | | 91 | | | | | | | | | | |
| 4 | 138 | 47 | 91 | | | | | | | | | | |
| 5 | 180 | | | 180 | | | | | | | | | |
| 6 | 227 | 47 | | 180 | | | | | | | | | |
| 7 | 271 | | 91 | 180 | | | | | | | | | |
| 8 | 318 | 47 | 91 | 180 | | | | | | | | | |
| 9 | 390 | | | | 390 | | | | | | | | |
| 10 | 437 | 47 | | | 390 | | | | | | | | |
| 11 | 481 | | 91 | | 390 | | | | | | | | |
| 12 | 528 | 47 | 91 | | 390 | | | | | | | | |
| 13 | 570 | | | 180 | 390 | | | | | | | | |
| 14 | 617 | 47 | | 180 | 390 | | | | | | | | |
| 15 | 661 | | 91 | 180 | 390 | | | | | | | | |
| 16 | 708 | 47 | 91 | 180 | 390 | | | | | | | | |
| 17 | 750 | | | | | 750 | | | | | | | |
| 18 | 797 | 47 | | | | 750 | | | | | | | |
| 19 | 841 | | 91 | | | 750 | | | | | | | |
| 20 | 888 | 47 | 91 | | | 750 | | | | | | | |
| 21 | 930 | | | 180 | | 750 | | | | | | | |
| 22 | 977 | 47 | | 180 | | 750 | | | | | | | |
| 23 | 1000 | | | | | | | 1000 | | | | | |
| 24 | 1047 | 47 | | | | | | 1000 | | | | | |
| 25 | 1091 | | 91 | | | | | 1000 | | | | | |
| 26 | 1138 | 47 | 91 | | | | | 1000 | | | | | |
| 27 | 1180 | | | 180 | | | | 1000 | | | | | |
| 28 | 1227 | 47 | | 180 | | | | 1000 | | | | | |
| 29 | 1271 | | 91 | 180 | | | | 1000 | | | | | |
| 30 | 1318 | 47 | 91 | 180 | | | | 1000 | | | | | |
| 31 | 1390 | | | | 390 | | | 1000 | | | | | |
| 32 | 1437 | 47 | | | 390 | | | 1000 | | | | | |
| 33 | 1481 | | 91 | | 390 | | | 1000 | | | | | |
| 34 | 1528 | 47 | 91 | | 390 | | | 1000 | | | | | |
| 35 | 1570 | | | 180 | 390 | | | 1000 | | | | | |
| 36 | 1617 | 47 | | 180 | 390 | | | 1000 | | | | | |
| 37 | 1661 | | 91 | 180 | 390 | | | 1000 | | | | | |
| 38 | 1708 | 47 | 91 | 180 | 390 | | | 1000 | | | | | |
| 39 | 1750 | | | | | 750 | | 1000 | | | | | |
| 40 | 1797 | 47 | | | | 750 | | 1000 | | | | | |
| 41 | 1841 | | 91 | | | 750 | | 1000 | | | | | |
| 42 | 1888 | 47 | 91 | | | 750 | | 1000 | | | | | |
| 43 | 1930 | | | 180 | | 750 | | 1000 | | | | | |
| 44 | 1977 | 47 | | 180 | | 750 | | 1000 | | | | | |
| 45 | 2000 | | | | | | | 1000 | 1000 | | | | |
| 46 | 2047 | 47 | | | | | | 1000 | 1000 | | | | |
| 47 | 2091 | | 91 | | | | | 1000 | 1000 | | | | |
| 48 | 2138 | 47 | 91 | | | | | 1000 | 1000 | | | | |
| 49 | 2180 | | | 180 | | | | 1000 | 1000 | | | | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 50 | 2227 | 47 | | 180 | | | | 1000 | 1000 | | | | |
| 51 | 2271 | | 91 | 180 | | | | 1000 | 1000 | | | | |
| 52 | 2318 | 47 | 91 | 180 | | | | 1000 | 1000 | | | | |
| 53 | 2390 | | | | 390 | | | 1000 | 1000 | | | | |
| 54 | 2437 | 47 | | | 390 | | | 1000 | 1000 | | | | |
| 55 | 2481 | | 91 | | 390 | | | 1000 | 1000 | | | | |
| 56 | 2528 | 47 | 91 | | 390 | | | 1000 | 1000 | | | | |
| 57 | 2570 | | | 180 | 390 | | | 1000 | 1000 | | | | |
| 58 | 2617 | 47 | | 180 | 390 | | | 1000 | 1000 | | | | |
| 59 | 2661 | | 91 | 180 | 390 | | | 1000 | 1000 | | | | |
| 60 | 2708 | 47 | 91 | 180 | 390 | | | 1000 | 1000 | | | | |
| 61 | 2750 | | | | | 750 | | 1000 | 1000 | | | | |
| 62 | 2797 | 47 | | | | 750 | | 1000 | 1000 | | | | |
| 63 | 2841 | | 91 | | | 750 | | 1000 | 1000 | | | | |
| 64 | 2888 | 47 | 91 | | | 750 | | 1000 | 1000 | | | | |
| 65 | 2930 | | | 180 | | 750 | | 1000 | 1000 | | | | |
| 66 | 2977 | 47 | | 180 | | 750 | | 1000 | 1000 | | | | |
| 67 | 3000 | | | | | | | 1000 | 1000 | 1000 | | | |
| 68 | 3047 | 47 | | | | | | 1000 | 1000 | 1000 | | | |
| 69 | 3091 | | 91 | | | | | 1000 | 1000 | 1000 | | | |
| 70 | 3138 | 47 | 91 | | | | | 1000 | 1000 | 1000 | | | |
| 71 | 3180 | | | 180 | | | | 1000 | 1000 | 1000 | | | |
| 72 | 3227 | 47 | | 180 | | | | 1000 | 1000 | 1000 | | | |
| 73 | 3271 | | 91 | 180 | | | | 1000 | 1000 | 1000 | | | |
| 74 | 3318 | 47 | 91 | 180 | | | | 1000 | 1000 | 1000 | | | |
| 75 | 3390 | | | | 390 | | | 1000 | 1000 | 1000 | | | |
| 76 | 3437 | 47 | | | 390 | | | 1000 | 1000 | 1000 | | | |
| 77 | 3481 | | 91 | | 390 | | | 1000 | 1000 | 1000 | | | |
| 78 | 3528 | 47 | 91 | | 390 | | | 1000 | 1000 | 1000 | | | |
| 79 | 3570 | | | 180 | 390 | | | 1000 | 1000 | 1000 | | | |
| 80 | 3617 | 47 | | 180 | 390 | | | 1000 | 1000 | 1000 | | | |
| 81 | 3661 | | 91 | 180 | 390 | | | 1000 | 1000 | 1000 | | | |
| 82 | 3708 | 47 | 91 | 180 | 390 | | | 1000 | 1000 | 1000 | | | |
| 83 | 3750 | | | | | 750 | | 1000 | 1000 | 1000 | | | |
| 84 | 3797 | 47 | | | | 750 | | 1000 | 1000 | 1000 | | | |
| 85 | 3841 | | 91 | | | 750 | | 1000 | 1000 | 1000 | | | |
| 86 | 3888 | 47 | 91 | | | 750 | | 1000 | 1000 | 1000 | | | |
| 87 | 3930 | | | 180 | | 750 | | 1000 | 1000 | 1000 | | | |
| 88 | 3977 | 47 | | 180 | | 750 | | 1000 | 1000 | 1000 | | | |
| 89 | 4000 | | | | | | | 1000 | 1000 | 1000 | 1000 | | |
| 90 | 4047 | 47 | | | | | | 1000 | 1000 | 1000 | 1000 | | |
| 91 | 4091 | | 91 | | | | | 1000 | 1000 | 1000 | 1000 | | |
| 92 | 4138 | 47 | 91 | | | | | 1000 | 1000 | 1000 | 1000 | | |
| 93 | 4180 | | | 180 | | | | 1000 | 1000 | 1000 | 1000 | | |
| 94 | 4227 | 47 | | 180 | | | | 1000 | 1000 | 1000 | 1000 | | |
| 95 | 4271 | | 91 | 180 | | | | 1000 | 1000 | 1000 | 1000 | | |
| 96 | 4318 | 47 | 91 | 180 | | | | 1000 | 1000 | 1000 | 1000 | | |
| 97 | 4390 | | | | 390 | | | 1000 | 1000 | 1000 | 1000 | | |
| 98 | 4437 | 47 | | | 390 | | | 1000 | 1000 | 1000 | 1000 | | |
| 99 | 4481 | | 91 | | 390 | | | 1000 | 1000 | 1000 | 1000 | | |
| 100 | 4528 | 47 | 91 | | 390 | | | 1000 | 1000 | 1000 | 1000 | | |
| 101 | 4570 | | | 180 | 390 | | | 1000 | 1000 | 1000 | 1000 | | |
| 102 | 4617 | 47 | | 180 | 390 | | | 1000 | 1000 | 1000 | 1000 | | |
| 103 | 4661 | | 91 | 180 | 390 | | | 1000 | 1000 | 1000 | 1000 | | |
| 104 | 4708 | 47 | 91 | 180 | 390 | | | 1000 | 1000 | 1000 | 1000 | | |
| 105 | 4750 | | | | | 750 | | 1000 | 1000 | 1000 | 1000 | | |
| 106 | 4797 | 47 | | | | 750 | | 1000 | 1000 | 1000 | 1000 | | |
| 107 | 4841 | | 91 | | | 750 | | 1000 | 1000 | 1000 | 1000 | | |
| 108 | 4888 | 47 | 91 | | | 750 | | 1000 | 1000 | 1000 | 1000 | | |
| 109 | 4930 | | | 180 | | 750 | | 1000 | 1000 | 1000 | 1000 | | |
| 110 | 4977 | 47 | | 180 | | 750 | | 1000 | 1000 | 1000 | 1000 | | |
| 111 | 5000 | | | | | | | 1000 | 1000 | 1000 | 1000 | 1000 | |
| 112 | 5047 | 47 | | | | | | 1000 | 1000 | 1000 | 1000 | 1000 | |
| 113 | 5091 | | 91 | | | | | 1000 | 1000 | 1000 | 1000 | 1000 | |
| 114 | 5138 | 47 | 91 | | | | | 1000 | 1000 | 1000 | 1000 | 1000 | |
| 115 | 5180 | | | 180 | | | | 1000 | 1000 | 1000 | 1000 | 1000 | |
| 116 | 5227 | 47 | | 180 | | | | 1000 | 1000 | 1000 | 1000 | 1000 | |
| 117 | 5271 | | 91 | 180 | | | | 1000 | 1000 | 1000 | 1000 | 1000 | |
| 118 | 5318 | 47 | 91 | 180 | | | | 1000 | 1000 | 1000 | 1000 | 1000 | |
| 119 | 5390 | | | | 390 | | | 1000 | 1000 | 1000 | 1000 | 1000 | |
| 120 | 5437 | 47 | | | 390 | | | 1000 | 1000 | 1000 | 1000 | 1000 | |
| 121 | 5481 | | 91 | | 390 | | | 1000 | 1000 | 1000 | 1000 | 1000 | |
| 122 | 5528 | 47 | 91 | | 390 | | | 1000 | 1000 | 1000 | 1000 | 1000 | |
| 123 | 5570 | | | 180 | 390 | | | 1000 | 1000 | 1000 | 1000 | 1000 | |
| 124 | 5617 | 47 | | 180 | 390 | | | 1000 | 1000 | 1000 | 1000 | 1000 | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 125 | 5661 |    | 91 | 180 | 390 |     |      | 1000 | 1000 | 1000 | 1000 | 1000 |      |
| 126 | 5708 | 47 | 91 | 180 | 390 |     |      | 1000 | 1000 | 1000 | 1000 | 1000 |      |
| 127 | 5750 |    |    |     |     | 750 |      | 1000 | 1000 | 1000 | 1000 | 1000 |      |
| 128 | 5797 | 47 |    |     |     | 750 |      | 1000 | 1000 | 1000 | 1000 | 1000 |      |
| 129 | 5841 |    | 91 |     |     | 750 |      | 1000 | 1000 | 1000 | 1000 | 1000 |      |
| 130 | 5888 | 47 | 91 |     |     | 750 |      | 1000 | 1000 | 1000 | 1000 | 1000 |      |
| 131 | 5930 |    |    | 180 |     | 750 |      | 1000 | 1000 | 1000 | 1000 | 1000 |      |
| 132 | 5977 | 47 |    | 180 |     | 750 |      | 1000 | 1000 | 1000 | 1000 | 1000 |      |
| 133 | 6000 |    |    |     |     |     |      | 1000 | 1000 | 1000 | 1000 | 1000 | 1000 |
| 134 | 6047 | 47 |    |     |     |     |      | 1000 | 1000 | 1000 | 1000 | 1000 | 1000 |
| 135 | 6091 |    | 91 |     |     |     |      | 1000 | 1000 | 1000 | 1000 | 1000 | 1000 |
| 136 | 6138 | 47 | 91 |     |     |     |      | 1000 | 1000 | 1000 | 1000 | 1000 | 1000 |
| 137 | 6180 |    |    | 180 |     |     |      | 1000 | 1000 | 1000 | 1000 | 1000 | 1000 |
| 138 | 6227 | 47 |    | 180 |     |     |      | 1000 | 1000 | 1000 | 1000 | 1000 | 1000 |
| 139 | 6271 |    | 91 | 180 |     |     |      | 1000 | 1000 | 1000 | 1000 | 1000 | 1000 |
| 140 | 6318 | 47 | 91 | 180 |     |     |      | 1000 | 1000 | 1000 | 1000 | 1000 | 1000 |
| 141 | 6390 |    |    |     | 390 |     |      | 1000 | 1000 | 1000 | 1000 | 1000 | 1000 |
| 142 | 6437 | 47 |    |     | 390 |     |      | 1000 | 1000 | 1000 | 1000 | 1000 | 1000 |
| 143 | 6481 |    | 91 |     | 390 |     |      | 1000 | 1000 | 1000 | 1000 | 1000 | 1000 |
| 144 | 6528 | 47 | 91 |     | 390 |     |      | 1000 | 1000 | 1000 | 1000 | 1000 | 1000 |
| 145 | 6570 |    |    | 180 | 390 |     |      | 1000 | 1000 | 1000 | 1000 | 1000 | 1000 |
| 146 | 6617 | 47 |    | 180 | 390 |     |      | 1000 | 1000 | 1000 | 1000 | 1000 | 1000 |
| 147 | 6661 |    | 91 | 180 | 390 |     |      | 1000 | 1000 | 1000 | 1000 | 1000 | 1000 |
| 148 | 6708 | 47 | 91 | 180 | 390 |     |      | 1000 | 1000 | 1000 | 1000 | 1000 | 1000 |
| 149 | 6750 |    |    |     |     | 750 |      | 1000 | 1000 | 1000 | 1000 | 1000 | 1000 |
| 150 | 6797 | 47 |    |     |     | 750 |      | 1000 | 1000 | 1000 | 1000 | 1000 | 1000 |
| 151 | 6841 |    | 91 |     |     | 750 |      | 1000 | 1000 | 1000 | 1000 | 1000 | 1000 |
| 152 | 6888 | 47 | 91 |     |     | 750 |      | 1000 | 1000 | 1000 | 1000 | 1000 | 1000 |
| 153 | 6930 |    |    | 180 |     | 750 |      | 1000 | 1000 | 1000 | 1000 | 1000 | 1000 |
| 154 | 6977 | 47 |    | 180 |     | 750 |      | 1000 | 1000 | 1000 | 1000 | 1000 | 1000 |
| 155 | 7021 |    | 91 | 180 |     | 750 |      | 1000 | 1000 | 1000 | 1000 | 1000 | 1000 |
| 156 | 7068 | 47 | 91 | 180 |     | 750 |      | 1000 | 1000 | 1000 | 1000 | 1000 | 1000 |
| 157 | 7140 |    |    |     | 390 | 750 |      | 1000 | 1000 | 1000 | 1000 | 1000 | 1000 |
| 158 | 7187 | 47 |    |     | 390 | 750 |      | 1000 | 1000 | 1000 | 1000 | 1000 | 1000 |
| 159 | 7231 |    | 91 |     | 390 | 750 |      | 1000 | 1000 | 1000 | 1000 | 1000 | 1000 |
| 160 | 7278 | 47 | 91 |     | 390 | 750 |      | 1000 | 1000 | 1000 | 1000 | 1000 | 1000 |
| 161 | 7320 |    |    | 180 | 390 | 750 |      | 1000 | 1000 | 1000 | 1000 | 1000 | 1000 |
| 162 | 7367 | 47 |    | 180 | 390 | 750 |      | 1000 | 1000 | 1000 | 1000 | 1000 | 1000 |
| 163 | 7411 |    | 91 | 180 | 390 | 750 |      | 1000 | 1000 | 1000 | 1000 | 1000 | 1000 |
| 164 | 7458 | 47 | 91 | 180 | 390 | 750 |      | 1000 | 1000 | 1000 | 1000 | 1000 | 1000 |
| 165 | 7500 |    |    |     |     |     | 1500 | 1000 | 1000 | 1000 | 1000 | 1000 | 1000 |
| 166 | 7547 | 47 |    |     |     |     | 1500 | 1000 | 1000 | 1000 | 1000 | 1000 | 1000 |
| 167 | 7591 |    | 91 |     |     |     | 1500 | 1000 | 1000 | 1000 | 1000 | 1000 | 1000 |

It is understood that the variable capacitor 75-1 does not need to go sequentially through each step to achieve a desired total capacitance, but instead can use software to lookup the desired capacitor position to switch to it directly. It is further understood that while the exemplified embodiment uses two sets of coarse capacitors (first coarse capacitors and second coarse capacitors) in other embodiments more or less sets of coarse capacitors can be used. For example, three sets of course capacitors could be used, each with a different capacitance value. It is further understood that the variable capacitance system 55-1 can form part of any one of the impedance matching networks discussed above. For example, a matching network may include an input configured to operably couple to an RF source, an output configured to operably couple to a plasma chamber for manufacturing a semiconductor, and the variable capacitance system 55-1 of FIG. 18A. In other embodiments, the variable capacitance system discussed above can be used in other systems requiring variable capacitance.

Figure 18B:
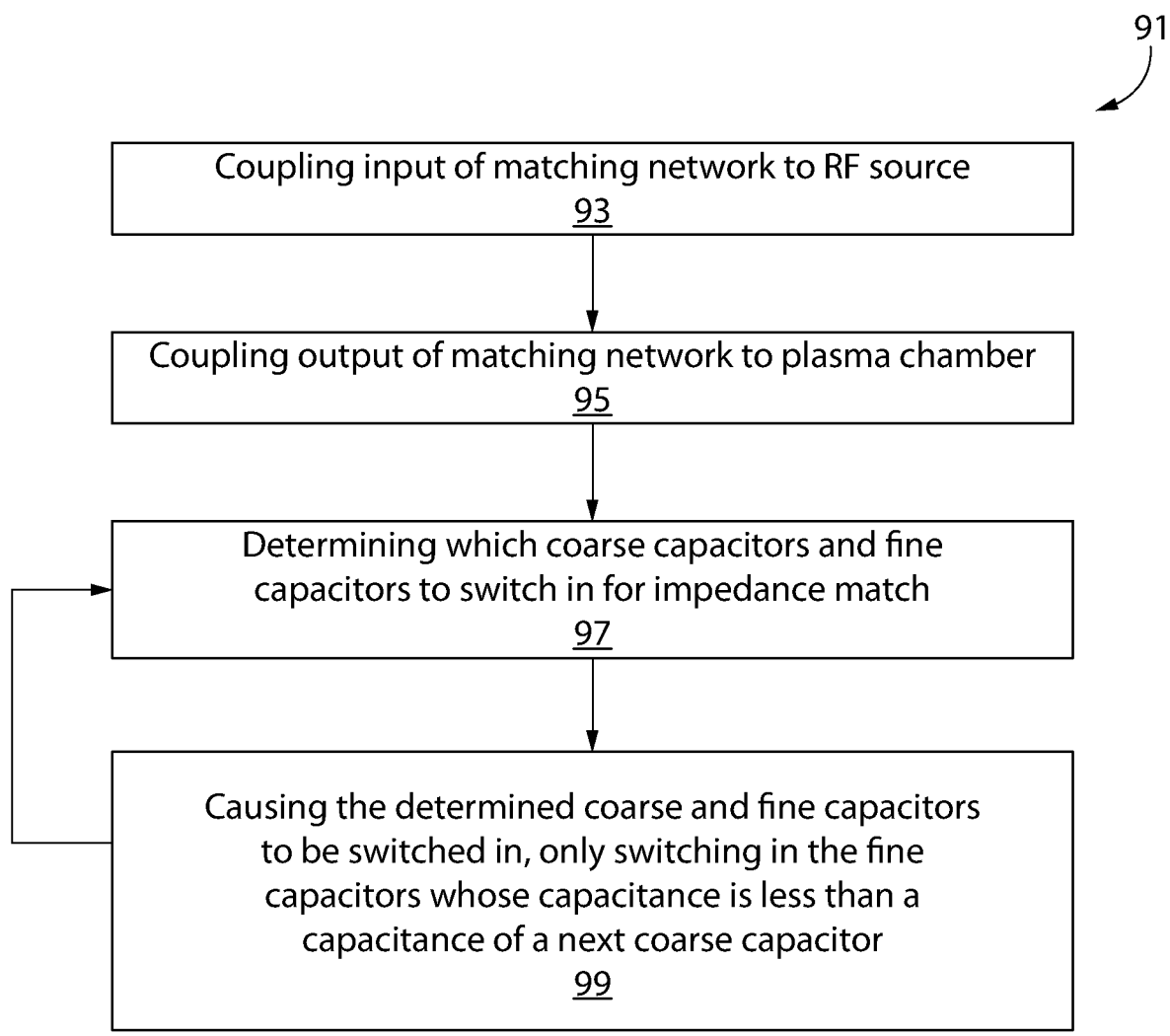
FIG. 18B is a flow chart of a method of matching impedance utilizing a restricted partial binary method for varying capacitance according to one embodiment.

FIG. 18B is a flow chart 91 of a method of matching impedance utilizing a restricted partial binary method for varying capacitance according to one embodiment. An input of a matching network is operably coupled to an RF source (operation 93). Further, an output of the matching network is operably coupled to a plasma chamber for manufacturing a semiconductor (operation 95). The matching network includes the variable capacitance system discussed above. The control unit determines which of the coarse capacitors and the fine capacitors to have switched in to achieve an impedance match (operation 97). The control circuit then causes the determined coarse and fine capacitors to be switched in (operation 99). The fine capacitors are restricted in being switched into the circuit in the manner described above in discussion of FIG. 18A. A method of manufacturing a semiconductor (such as the system displayed shown in FIG. 1) can also utilize the above restricted partial binary variable capacitance system. Further, a semiconductor processing tool (comprising a plasma camber and impedance matching network) can utilize the above restricted partial binary variable capacitance system, specifically, by incorporating the restricted partial binary variable capacitance system into its matching network.

The restricted partial binary setup described above provides multiple advantages. For example, by restricting one or more fine capacitors from switching in, the setup avoids overlap, that is, instances where there is more than one solution for a given impedance value. Further, the restricted partial binary setup allows the variable capacitor to provide a large range of capacitance values by allowing for the use of a high percentage of coarse capacitors. Further, the setup avoids large gaps in capacitance values. Further, less capacitors are needed, thus requiring less switches and causing the variable capacitor to take up less area.

Switching Circuit for Faster Matching

Figure 19:
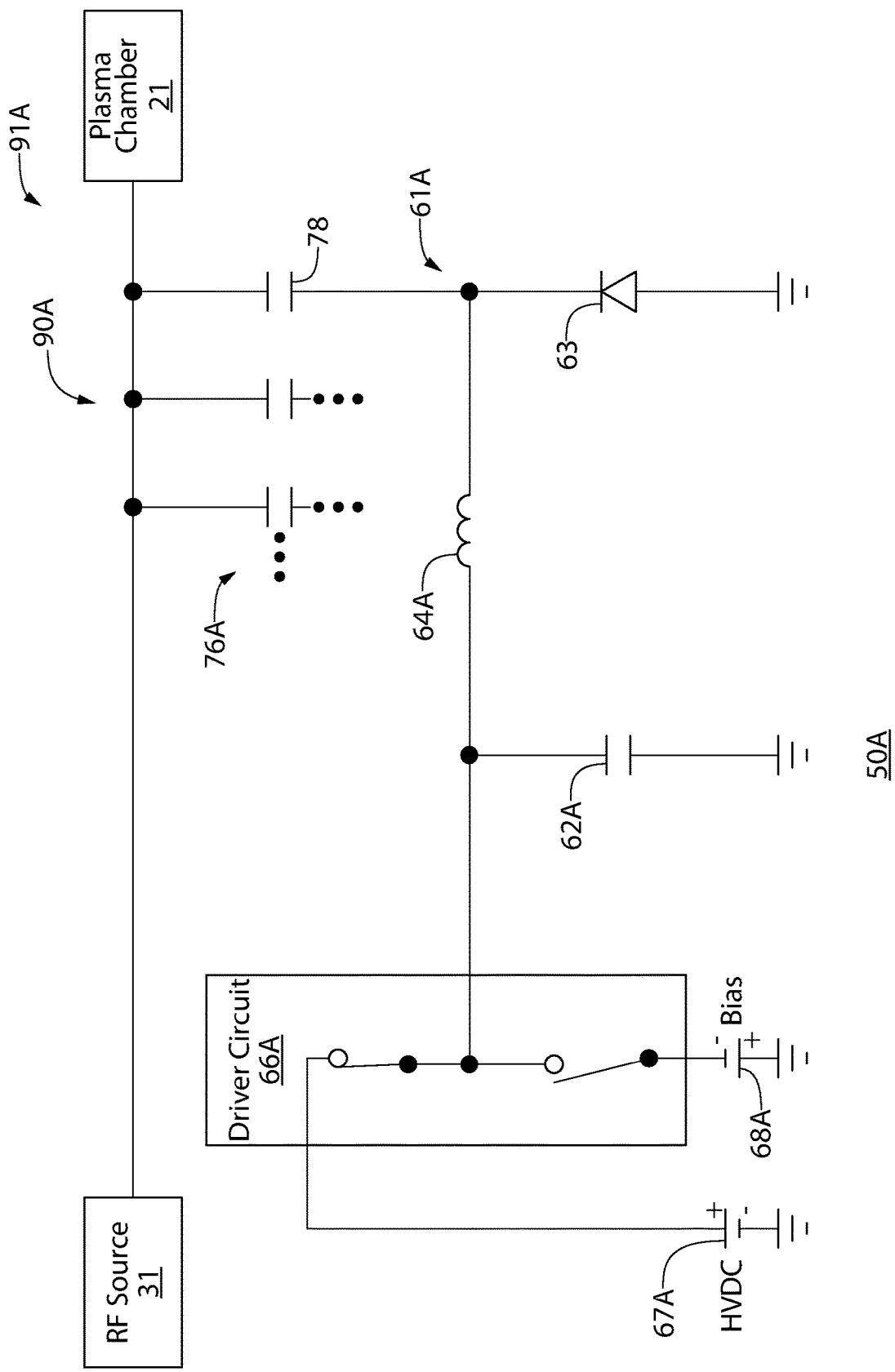
FIG. 19 is a system for manufacturing a semiconductor, the system including a matching network whose EVC utilizes a PIN-diode-based first switching circuit according to an embodiment.

In a matching network, a PIN diode may be used as an RF switch for each discrete capacitor of an EVC. FIG. 19 shows a system 50A for manufacturing a semiconductor, the system including a matching network 90A whose EVC 76A utilizes a PIN-diode-based first switching circuit 61A to switch in or out a discrete capacitor 78 of the EVC 76, according to an embodiment. Similar to FIG. 1, the system 50A includes an RF source 31 and a plasma chamber 21.

In the exemplified embodiment of FIG. 19, the PIN diode 63 is switched OFF by being reverse biased by a high voltage DC supply (HVDC 67A), and switched ON by being forward biased by a current supply (Bias 68A). Because RF voltage is also applied to the switch 63, the biases need to pass through a choke 64A to reduce the RF voltage at the driver circuit 66A. In this embodiment, the choke 64A used to apply the biases usually has large inductance values and may even be self-resonate at or near the RF frequency. This choke design creates a large attenuation and allows for a maximum bandwidth. This ensures that a minimum attenuation is met even with numerous variations.

This choke design may have drawbacks. The main problem is that it may affect the overall switching speed, where large voltages can be generated across the inductor. As shown in Equation 1 (voltage across an inductor), the voltage is equal to the inductance times the rate of change in current.

$$V = L\frac{di}{dt} \quad \text{(Equation 1)}$$

The current comes from the Bias and therefore is fixed. If the inductance of the choke needs to be large, then the bias being applied must gradually increase and decrease. As an example, if the inductance is 60 uH, the bias current is 0.5 Amps, and the switching speed is 10 ns, the voltage generated across the inductor would be 3000 Volts. This could damage components on the driver circuit. This voltage also oscillates and will cause the PIN diode to turn ON and OFF rapidly. If the switching speed is changed to 50 us, this voltage drops to only 0.6 Volts. To drop the inductance would also have a similar effect, but the isolation required prevents this.

The exemplified matching network 90A further includes a filtering capacitor 62A that is used for filtering to help block the RF from the driver circuit 66A. This filtering capacitance is typically a large value to give a low impedance to ground for the RF signal. This large capacitance, however, may add stress to the driver circuit 66A circuitry by creating additional power dissipation. The filtering capacitor 62A and choke inductor 64A can together be considered a filter.

The dissipation is difficult to calculate because of the complexity of the circuit, especially with the slow, nonlinear transition times of the driver circuit 66A. We do know the energy stored in the discrete capacitor 78 and the filtering capacitor 62A and the amount of time that it takes to fully discharge. Thus, the power dissipated per charge and discharge can be roughly calculated for the full system. Equation 2 may be used to calculate the energy stored in the discrete capacitor 78.

$$E = \frac{1}{2}CV^2 \quad \text{(Equation 2)}$$

Equation 3 may be used to calculate power dissipation from the energy dissipated over time.

$$P = \frac{E}{t} \quad \text{(Equation 3)}$$

If Equation 2 is substituted into Equation 3, the total power dissipated in the system from the discrete capacitor 78 charge/discharge can be calculated as seen in in Equation 4.

$$P = \frac{CV^2}{2t} \quad \text{(Equation 4)}$$

Accordingly, the total power dissipation per switching circuit 61A can be calculated. To continue with the previous example, the switching speed is 50 us. If the HVDC is set to 1650V and the total capacitance is 3400 pF, then the total power dissipated in the system is 93 W. This dissipation includes losses in the driver circuit switch, the power supply, the bias resistor, and anything else in series with the capacitor while it either charges or discharges.

Switching Circuit Utilizing Two PIN Diodes in Parallel

Figure 20:
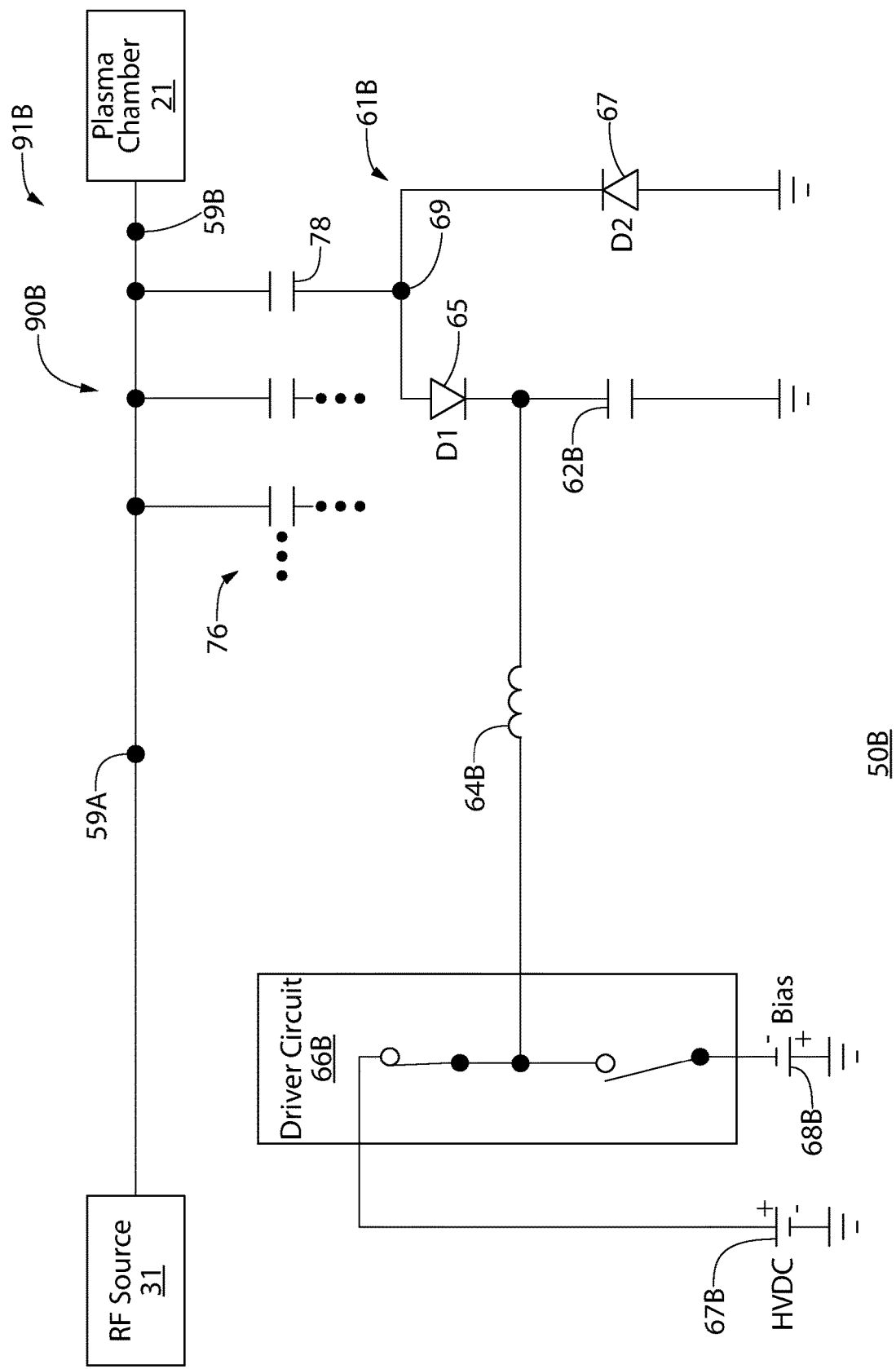
FIG. 20 is a system for manufacturing a semiconductor, the system including a matching network whose EVC utilizes a PIN-diode-based second switching circuit according to an embodiment.

FIG. 20 shows a system 50B for manufacturing a semiconductor similar to FIG. 19, but where the EVC 76 of the matching network 90B utilizes a second switching circuit 61B that has two PIN diodes 65, 67 connected in parallel, rather than a single PIN diode. The second RF switch (diode) is used to filter out the RF from the driver's circuitry, rather than a using a more complicated filter. Similar to FIG. 19, the system 50B includes an RF source 31 and a plasma chamber 21. Further, the matching network 90B includes an RF input 59A coupled to the RF source 31, and an RF output 59B coupled to the plasma chamber 21. The potential variations to the RF source, plasma chamber, and matching network discussed above with respect to the foregoing embodiments may apply also the components of system 50B. Further it is noted that, while matching network 90B includes only one shunt EVC 76, the invention is not so limited, as the matching network may be any type of matching network utilizing one or more EVCs, including a matching network having a series EVC, and/or a second shunt EVC.

In the exemplified embodiment of FIG. 20, the switching circuit 61B is switched OFF by being reverse biased by a high voltage DC supply (HVDC 67B), and switched ON by being forward biased by a current supply (Bias 68B). The invention is not so limited, however, as the switching circuit may be switched ON and OFF by alternative means. When the switching circuit 61B is in the ON condition, current flows from the Bias 68B through the two diodes 65, 67 to ground. This is shown in FIG. 21A, which represents the switching circuit 61B in the ON state. In this state, the diodes 65, 67 are equivalent to low value resistors 65-1, 65-2. This creates a low impedance. Since, from the perspective of the RF source 31, the second diode 67 is parallel to the first diode 65 and filtering capacitor 62B, the total impedance is low. This forces the RF voltage to drop across the discrete capacitor 78 with a relatively high impedance in comparison to the total impedance of the switching circuit 61B.

Figure 21B:
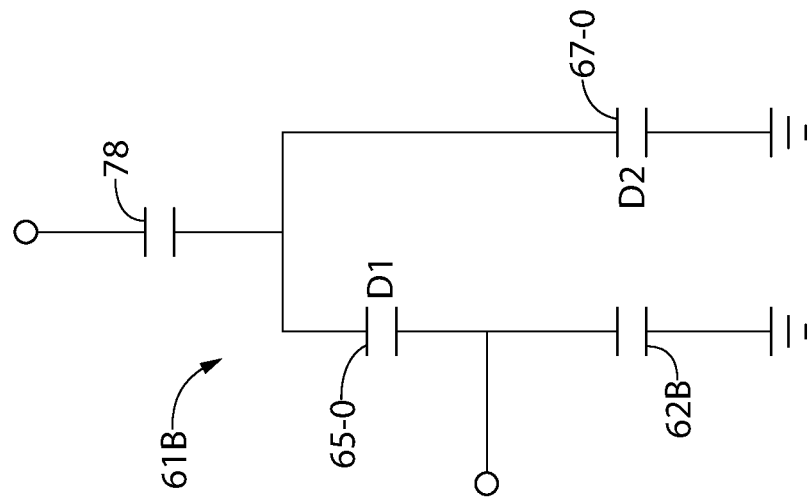
FIGS. 21A and 21B represent the second switching circuit in the ON and OFF states, respectively.
Figure 21A:
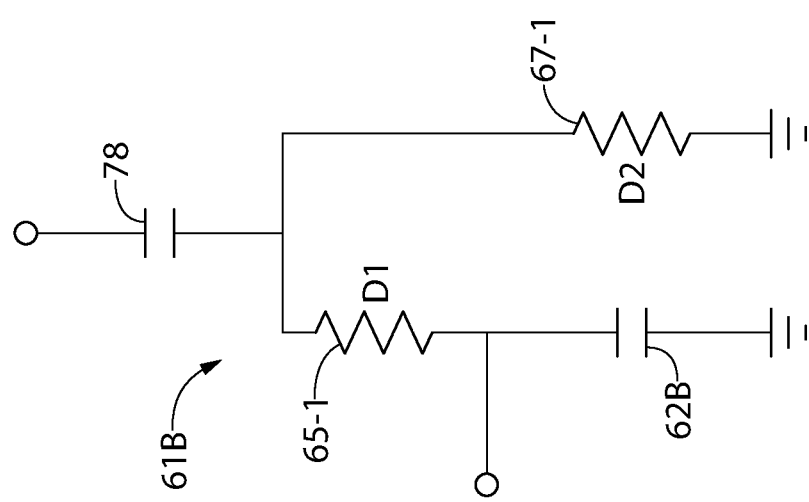

As shown in FIG. 21B, in the OFF condition, the diodes 65, 67 look like low value capacitors 65-0, 67-0. In this state, the HVDC 67B is applied to the diodes 65, 67. There should be an even DC voltage drop across the two diodes 65, 67. So, the node 69 between the diodes 65, 67 should be half the voltage of HVDC 67B. The filtering capacitor 62B creates an RF voltage divider with first diode 65. The voltage going to the driver circuit 66B is proportionate to this divider ratio plus some small drop across the discrete capacitor 78.

It will be noted that the first diode 65 has an anode and a cathode, and the second diode 67 has an anode and a cathode. In the exemplified embodiment, the anode of the first diode 65 is operably coupled to a first terminal of the discrete capacitor 78, the cathode of the second diode 67 is operably coupled to the first terminal of the discrete capacitor 78, and the anode is operably coupled to ground. Further, the cathode of the first diode 65 is coupled to the filtering capacitor 62B, the first diode 65 and the filtering capacitor 62B being parallel to the second diode 67. Further, the cathode of the first diode is coupled to the choke 64B, and the choke 64B is coupled to a driver circuit 66B. The invention, however, is not so limited, as other arrangements or components may be utilized. For example, in an alternative embodiment, the diodes' orientation is switched such that, while still in an opposing orientation, the cathode of the first diode is operably coupled to the first terminal of the discrete capacitor, and the anode of the second diode is operably coupled to the first terminal of the discrete capacitor. Further, while the exemplified embodiments use PIN diodes, the invention is not so limited, as other types of diodes may be utilized. For example, in an alternative embodiment, the second diode 67 is a PIN diode but the first diode is a different type of commonly available diode.

The following provides a comparison of the first switching circuit 61A (FIG. 19) and the second switching circuit 61B (FIG. 20) for a certain use case. The 13 MHz match will continue to be used for this comparison. The worst-case attenuation specification from the filter 62A, 64A of FIG. 19 is 45 dB. In the ON case, the attenuation comes from the second diode 67 creating a low impedance to ground. In the OFF case, the attenuation comes from the voltage divider of the first diode 65 and the filtering capacitor 62B.

For the ON case, each diode 65, 67 has a resistance of 150 m$\Omega$. The discrete capacitor 78 is where the RF voltage will drop. To achieve the required attenuation, the discrete capacitor 78 needs to be 2780 pF or less. This is a very large value, and the match would easily exceed the current rating of the capacitor or diode. Typically, the maximum capacitance used for matching at 13 MHz is around 100 pF. So, this is a nonissue.

For the OFF case, if each diode 65, 67 is assumed to have 2.5 pF of capacitance. To achieve 45 dB of attenuation, the filtering capacitor 62B needs a minimum value of 442 pF. The next standard value would be 470 pF. This gives an attenuation of 45.5 dB.

The power dissipation can now be calculated as before. With this reduced capacitance value, the dissipation goes down to 12.8 W. If the maximum acceptable power dissipation is 93 W, as before, then the switching transition time can be decreased from 50 us to 6.9 us, an 86% reduction. One could go a step further in reducing the capacitance by replacing the filtering capacitor 62B with a series LC resonator. This would create a very low impedance while also reducing the capacitance seen by the driver circuit 66B. Care should be taken, as half of the RF current from the discrete capacitor 78 will now flow through the LC resonator, which can be significant and could produce large voltages across the LC resonator's inductor and capacitor.

The choke 64B (or more advanced filter topology) is not needed, but provides additional isolation to the driver circuit 66B. Since this inductance value will be low, the voltage generated from it is negligible. An additional filtering capacitor may also be placed on the node where the choke meets the driver circuit. This would add to the total capacitance that is seen from the driver, and therefore would increase the dissipation seen from the driver circuit 66B. The other filtering capacitor may be reduced to help reduce this.

The second switching circuit 61B provides many advantages. A major benefit of the second switching circuit 61B is that the RF voltage is significantly dropped before the choke 64B. This means that the choke 64B can be drastically reduced or even eliminated. The high voltage ringing may be eliminated, and therefore the choke 64B may no longer be the limiting factor on switching speed. Further, the filtering capacitor 62B of the second switching circuit 61B may be significantly smaller. Thus, the power dissipated from the switching is reduced, allowing either the switching speed to be increased or the frequency of switching to be increased, or some combination of both. This could also increase the reliability of the driver circuit 66B as the power dissipation is considerably reduced. Using two PIN diodes 65, 67 in parallel per discrete capacitor 78 allows for more current per channel. The current will not be split evenly, unless the filtering capacitor 62B is replaced with an LC resonator, and therefore the maximum current will be doubled.

It is noted that, as a result of using two PIN diodes, the HVDC is dropped across twice as many PIN diodes. To have the same blocking voltage, the HVDC voltage must be doubled. Further, using two PIN diodes will require an adjustment to the Bias. If a dual PIN diode switch was originally used, then there will now be four diodes in series. If there is a 0.5 Volt drop per diode, the total drop would be 2 Volts instead of one. This may require the Bias voltage to be increased, which could require it to have a higher power dissipation, or require multiple bias supplies.

It is further noted that the switching circuits discussed above may be used as part of a method of matching impedance, or a method of manufacturing a semiconductor, where the switching circuits are used to switch in or out discrete capacitors of an EVC to thereby cause an impedance match. Further, a matching network using one or more of the switching circuits discussed above may for part of a semiconductor processing tool (such as tool 91A or 91B), the semiconductor processing tool further comprising a plasma chamber (such as chamber 21).

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

While the invention or inventions have been described with respect to specific examples, those skilled in the art will appreciate that there are numerous variations and permutations of the above described invention(s). It is to be understood that other embodiments may be utilized and structural and functional modifications may be made without departing from the scope of the present invention(s). Thus, the spirit and scope should be construed broadly as set forth in the appended claims.

What is claimed is:

1. A matching network comprising:
    a radio frequency (RF) input operably coupled to an RF source;
    an RF output operably coupled to a plasma chamber; and
    at least one electronically variable capacitor (EVC), each EVC comprising discrete capacitors each having a corresponding switching circuit, each switching circuit configured to switch in and out its corresponding discrete capacitor to alter a total capacitance of the EVC;
    wherein each switching circuit comprises:
        a first diode operably coupled to the discrete capacitor;
        a capacitor coupled in series with the first diode; and
        a second diode operably coupled to the discrete capacitor, the second diode parallel to the first diode and the capacitor coupled in series;
        wherein the second diode is coupled at one end to a ground such that, when the switching circuit is switched ON to switch in the discrete capacitor, a path between the second diode and the ground has a low DC impedance as compared to an impedance of the discrete capacitor.

2. The matching network of claim 1 wherein:
    an anode of the first diode is operably coupled to a first terminal of the discrete capacitor, and a cathode of the second diode is operably coupled to the first terminal of the discrete capacitor; or
    a cathode of the first diode is operably coupled to a first terminal of the discrete capacitor, and an anode of the second diode is operably coupled to the first terminal of the discrete capacitor.

3. The matching network of claim 2 wherein the second diode is a PIN diode.

4. The matching network of claim 3 wherein the first diode is a PIN diode.

5. The matching network of claim 2 wherein the first diode is operably coupled to a choke.

6. The matching network of claim 5 wherein the choke is operably coupled to a driver circuit.

7. The matching network of claim 1 wherein:
    the first diode is operably coupled to a driver circuit, which is coupled to a biasing current supply; and
    to switch the switching circuit ON and thereby switch in the discrete capacitor, a DC current flows from the biasing current supply and through the first diode and the second diode.

8. The matching network of claim 1 wherein there is no capacitor between the second diode and the ground.

9. A method of matching an impedance comprising:
    coupling an RF input of a matching network to an RF source;
    coupling an RF output of the matching network to a plasma chamber, wherein the matching network comprises at least one EVC, each EVC comprising discrete capacitors each having a corresponding switching circuit, wherein each switching circuit for a corresponding discrete capacitor comprises:
        a first diode operably coupled to the discrete capacitor;
        a capacitor coupled in series with the first diode; and
        a second diode operably coupled to the discrete capacitor, the second diode parallel to the first diode and the capacitor coupled in series;
        wherein the second diode is coupled at one end to a ground such that, when the switching circuit is switched ON to switch in the discrete capacitor, a path between the second diode and the ground has a low DC impedance as compared to an impedance of the discrete capacitor; and
    matching an impedance by at least one of the switching circuits of the at least one EVC switching in or out its corresponding discrete capacitor to alter a total capacitance of the EVC.

10. The method of claim 9 wherein:
    an anode of the first diode is operably coupled to a first terminal of the discrete capacitor, and a cathode of the second diode is operably coupled to the first terminal of the discrete capacitor; or
    a cathode of the first diode is operably coupled to a first terminal of the discrete capacitor, and an anode of the second diode is operably coupled to the first terminal of the discrete capacitor.

11. The method of claim 10 wherein the second diode is a PIN diode.

12. The method of claim 11 wherein the first diode is a PIN diode.

13. The method of claim 10 wherein the first diode is operably coupled to a choke.

14. The method of claim 13 wherein the choke is operably coupled to a driver circuit.

15. The method of claim 9 wherein:
    the first diode is operably coupled to a driver circuit, which is coupled to a biasing current supply; and
    to switch the switching circuit ON and thereby switch in the discrete capacitor, a DC current flows from the biasing current supply and through the first diode and the second diode.

16. A semiconductor processing tool comprising:
    a plasma chamber configured to deposit a material onto a substrate or etch a material from the substrate; and
    an impedance matching network operably coupled to the plasma chamber, the matching network comprising:
        a RF input operably coupled to an RF source;
        an RF output operably coupled to the plasma chamber; and
        at least one EVC, each EVC comprising discrete capacitors each having a corresponding switching circuit, each switching circuit configured to switch in and out its corresponding discrete capacitor to alter a total capacitance of the EVC;
        wherein each switching circuit comprises:
            a first diode operably coupled to the discrete capacitor;
            a capacitor coupled in series with the first diode; and
            a second diode operably coupled to the discrete capacitor, the second diode parallel to the first diode and the capacitor coupled in series;
            wherein the second diode is coupled at one end to a ground such that, when the switching circuit is switched ON to switch in the discrete capacitor, a path between the second diode and the ground has a low DC impedance as compared to an impedance of the discrete capacitor.

17. The processing tool of claim 16 wherein:
    an anode of the first diode is operably coupled to a first terminal of the discrete capacitor, and a cathode of the second diode is operably coupled to the first terminal of the discrete capacitor; or
    a cathode of the first diode is operably coupled to a first terminal of the discrete capacitor, and an anode of the second diode is operably coupled to the first terminal of the discrete capacitor.

18. The processing tool of claim 17 wherein the second diode is a PIN diode.

19. The processing tool of claim 18 wherein the first diode is a PIN diode.

20. The processing tool of claim 17 wherein the first diode is operably coupled to a choke.

21. A method of fabricating a semiconductor, the method comprising:
- placing a substrate in a plasma chamber configured to deposit a material layer on the substrate or etch a material layer from the substrate;
- energizing plasma within the plasma chamber by coupling RF power from an RF source to the plasma chamber to perform the deposition or etching; and
- while energizing the plasma, carrying out an impedance match by an impedance matching network coupled between the plasma chamber and the RF source, the matching network comprising:
  - at least one EVC, each EVC comprising discrete capacitors each having a corresponding switching circuit, each switching circuit configured to switch in and out its corresponding discrete capacitor to alter a total capacitance of the EVC;
- wherein each switching circuit comprises:
  - a first diode operably coupled to the discrete capacitor;
  - a capacitor coupled in series with the first diode; and
  - a second diode operably coupled to the discrete capacitor, the second diode parallel to the first diode and the capacitor coupled in series;
  - wherein the second diode is coupled at one end to a ground such that, when the switching circuit is switched ON to switch in the discrete capacitor, a path between the second diode and the ground has a low DC impedance as compared to an impedance of the discrete capacitor.

* * * * *